(12) United States Patent
Kyosuna et al.

(10) Patent No.: US 11,921,330 B2
(45) Date of Patent: Mar. 5, 2024

(54) LIGHT RECEIVING DEVICE, AND LIGHT TRANSMITTING AND RECEIVING DEVICE

(71) Applicant: NEC Corporation, Tokyo (JP)

(72) Inventors: Satoshi Kyosuna, Tokyo (JP); Koya Takata, Tokyo (JP); Fujio Okumura, Tokyo (JP)

(73) Assignee: NEC CORPORATION, Tokyo (JP)

( * ) Notice: Subject to any disclaimer, the term of this patent is extended or adjusted under 35 U.S.C. 154(b) by 783 days.

(21) Appl. No.: 16/980,745

(22) PCT Filed: Mar. 20, 2018

(86) PCT No.: PCT/JP2018/011024
§ 371 (c)(1),
(2) Date: Sep. 14, 2020

(87) PCT Pub. No.: WO2019/180813
PCT Pub. Date: Sep. 26, 2019

(65) Prior Publication Data
US 2021/0003792 A1    Jan. 7, 2021

(51) Int. Cl.
*H04N 5/335* (2011.01)
*G02B 6/42* (2006.01)
(Continued)

(52) U.S. Cl.
CPC ............. *G02B 6/42* (2013.01); *G02B 6/4214* (2013.01); *H04B 10/25* (2013.01); *H04B 10/66* (2013.01);
(Continued)

(58) Field of Classification Search
CPC ................................. G02B 6/42; H04N 9/315
See application file for complete search history.

(56) References Cited

U.S. PATENT DOCUMENTS 9,231,144 B2   1/2016  Liu
2010/0098430 A1  4/2010  Chui et al.
(Continued)

FOREIGN PATENT DOCUMENTS

EP    2562889 A1   2/2013
JP    H04-147108 A   5/1992
(Continued)

OTHER PUBLICATIONS

JP Office Action for JP Application No. 2020-507163, dated Jun. 7, 2022 with English Translation.
(Continued)

*Primary Examiner* — Gary C Vieaux

(57) ABSTRACT

In order to efficiently receive spatial light without using a condensing lens, this light receiving device comprises: a first light guide body that has at least a first light receiving
(Continued)

surface and a first light emission end and guides, in an oriented manner, signal light entering from the first light receiving surface to the first light emission end; a second light guide body that has at least a second light receiving surface and a second light emission end, the second light receiving surface being connected to the first light emission end, and that guides, in an oriented manner, signal light entering from the second light receiving surface to the second light emission end; and a light receiver that has a light receiving part connected to the second light emission end and that converts the signal light received by the light receiving part to an electrical signal.

18 Claims, 30 Drawing Sheets

(51) Int. Cl.
    *H04B 10/25*     (2013.01)
    *H04B 10/66*     (2013.01)
    *H04B 10/69*     (2013.01)
    *H04N 9/31*     (2006.01)
    *H04N 23/66*     (2023.01)

(52) U.S. Cl.
    CPC ............. *H04B 10/69* (2013.01); *H04N 9/312* (2013.01); *H04N 9/315* (2013.01); *H04N 23/66* (2023.01)

(56) References Cited

U.S. PATENT DOCUMENTS

| | | |
|---|---|---|
| 2010/0098439 A1 | 4/2010 | Shin et al. |
| 2012/0113605 A1 | 5/2012 | Zhang et al. |
| 2020/0326478 A1* | 10/2020 | Kyosuna ............ H04B 10/114 |

FOREIGN PATENT DOCUMENTS

| | | | |
|---|---|---|---|
| JP | H07-212318 A | | 8/1995 |
| JP | H09-148619 A | | 6/1997 |
| JP | 2002-048920 A | | 2/2002 |
| JP | 2005-017489 A | | 1/2005 |
| JP | 2005-019587 A | | 1/2005 |
| JP | 2005-295194 A | | 10/2005 |
| JP | 2007-057591 A | | 3/2007 |
| JP | 2007057591 A | * | 3/2007 |
| JP | 2009-267126 A | | 11/2009 |
| JP | 2012-105269 A | | 5/2012 |
| JP | 2015-170738 A | | 9/2015 |
| JP | 2016-035404 A | | 3/2016 |
| WO | WO-2017/169913 A1 | | 10/2017 |

OTHER PUBLICATIONS

International Search Report corresponding to PCT/JP2018/011024 dated Jun. 19, 2018 (2 pages).
Written Opinion PCT ISA 237 corresponding to PCT/JP2018/011024 dated Jun. 19, 2018 (8 pages).
Japanese Office Action for JP Application No. 2020-507163 dated Mar. 1, 2022 with English Translation.

* cited by examiner

LIGHT RECEIVING DEVICE, AND LIGHT TRANSMITTING AND RECEIVING DEVICE

CROSS REFERENCE TO RELATED APPLICATIONS

This application is a national stage application of International Application No. PCT/JP2018/011024 entitled "Light Receiving Device, and Light Transmitting and Receiving Device" filed on Mar. 20, 2018, the disclosures of which are hereby incorporated by reference in their entirety.

TECHNICAL FIELD

The present invention relates to a light receiving device, and a light transmitting and receiving device that are used for optical space communication.

BACKGROUND ART

In optical space communication, spatial light propagating in space is transmitted and received without using a medium such as an optical fiber. In order to receive signal light spreading and propagating in space, as large a condensing lens as possible is required. Further, a low-capacitance photodiode is required for performing high-speed communication in optical space communication.

PTL 1 discloses an imaging device including a focus detection optical system. The device in PTL 1 splits a light flux into a plurality of beams by placing a holographic optical element on an optical path of an imaging lens and guides at least one beam of the split light flux to the focus detection optical system.

CITATION LIST

Patent Literature

PTL 1: Japanese Unexamined Patent Application Publication No. H04-147108

SUMMARY OF INVENTION

Technical Problem

The device in PTL 1 allows downsizing of a photoelectric conversion device by guiding part of light condensed by a lens to the photoelectric conversion device. However, the device in PTL 1 does not receive much of the light condensed by the lens by the photoelectric conversion device and therefore needs to use a high-sensitivity photoelectric conversion device. In other words, the device in PTL 1 has a problem that an expensive low-capacitance photodiode needs to be used. A larger lens aperture allows increase in an amount of light received by the photoelectric conversion device and therefore allows use of a relatively inexpensive photodiode; however, there is a problem that a larger lens upsizes the device.

An object of the present invention is to resolve the aforementioned problems and provide a light receiving device capable of efficiently receiving spatial light without using a condensing lens.

Solution to Problem

A light receiving device according to an aspect of the present invention includes: a first light guide body including at least a first light receiving surface and a first emitting end and directionally guiding signal light entering from the first light receiving surface to the first emitting end; a second light guide body including at least a second light receiving surface and a second emitting end, the second light receiving surface being connected to the first emitting end of the first light guide body, and directionally guiding the signal light entering from the second light receiving surface to the second emitting end; and a light receiver including a light receiving part connected to the second emitting end and converting the signal light received by the light receiving part into an electric signal.

A light transmitting and receiving device according to an aspect of the present invention includes: a light receiving device including: a first light guide body including at least a first light receiving surface and a first emitting end, being formed in a cylindrical shape with the first light receiving surface as a side, and directionally guiding signal light entering from the first light receiving surface to the first emitting end formed on either one of an upper surface and an undersurface; a second light guide body including at least a second light receiving surface and a second emitting end, being formed in a ring shape with open ends according to a shape of the first emitting end of the first light guide body formed in a cylindrical shape, the second light receiving surface being connected to the first emitting end of the first light guide body, and directionally guiding the signal light entering from the second light receiving surface to the second emitting end; and a light receiver including a light receiving part connected to the second emitting end of the second light guide body, converting the signal light received by the light receiving part into an electric signal, and outputting the electric signal; and a light transmitting device being equipped inside a cylinder formed by the first light guide body, receiving an electric signal received from the light receiver, and projecting projection light based on a received electric signal.

Advantageous Effects of Invention

The present invention can provide a light receiving device capable of efficiently receiving spatial light without using a condensing lens.

EXAMPLE EMBODIMENT

Figure 1:
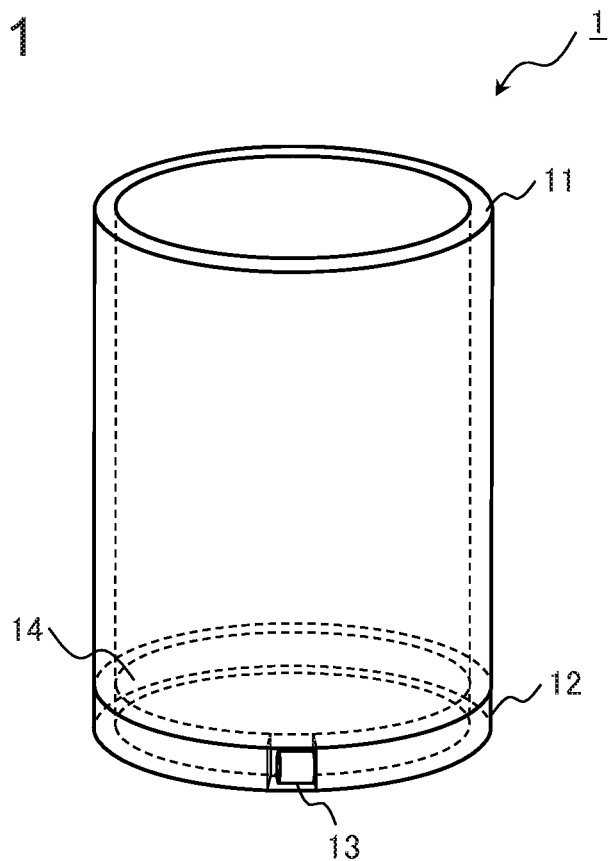
FIG. 1 is a perspective view of an example of a light receiving device according to a first example embodiment of the present invention.

Example embodiments of the present invention will be described below by use of drawings. Although technically preferred limitations for implementing the present invention are applied to the example embodiments described below, the scope of the invention is not limited thereto. In all drawings used for description of the following example embodiments, the same or similar parts are given the same or similar reference signs unless there is a specific reason. Repeated description of a similar component or operation may be omitted in the following example embodiments. A line indicating traveling of light in the drawings used for description of the following example embodiments is conceptual and does not accurately represent a traveling direction and/or a state of actual light. For example, in the following drawings, changes in a traveling direction and/or a state of light at an interface between air and substance due to refraction, reflection, diffusion, and/or the like may be omitted, and a light flux may be represented by a single line.

FIRST EXAMPLE EMBODIMENT

Figure 2:
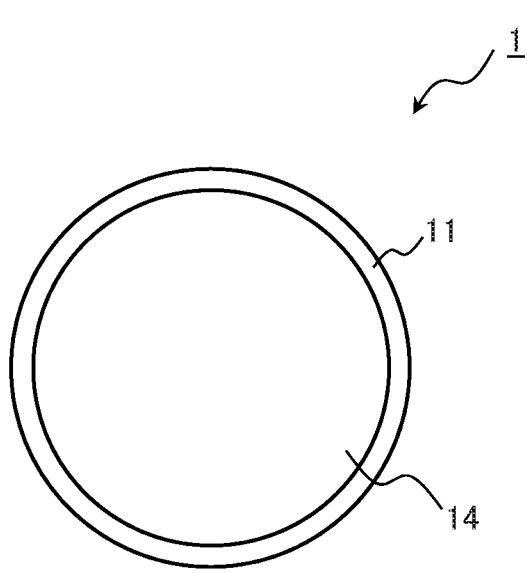
FIG. 2 is a top view of the example of the light receiving device according to the first example embodiment of the present invention.
Figure 3:
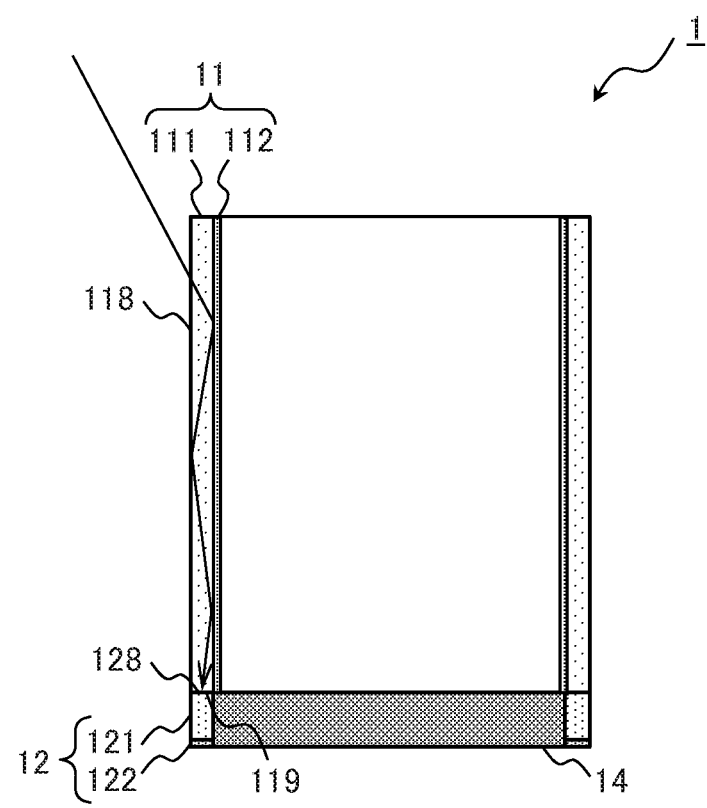
FIG. 3 is a cross-sectional view of the example of the light receiving device according to the first example embodiment of the present invention.
Figure 4:
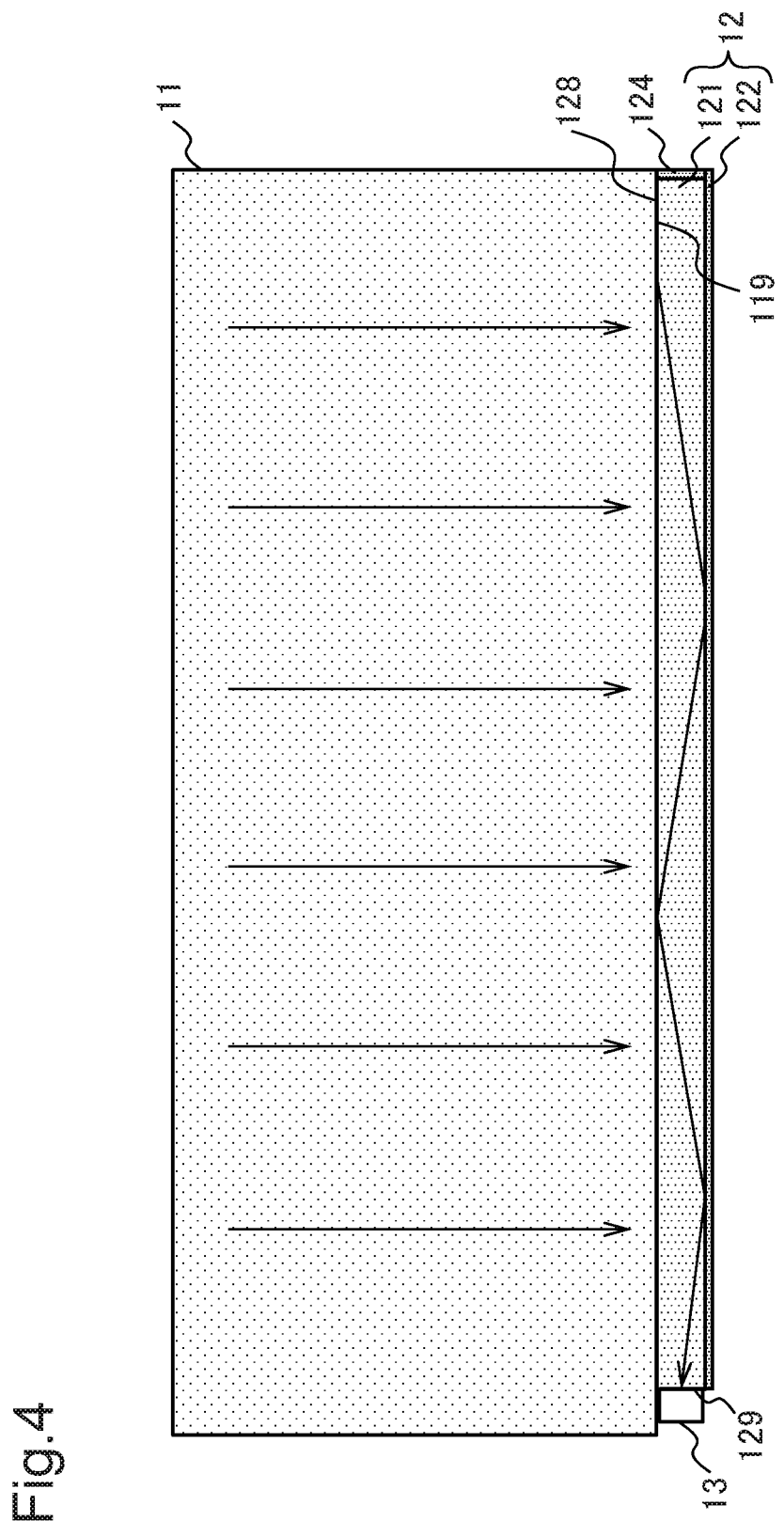
FIG. 4 is a development of the example of the light receiving device according to the first example embodiment of the present invention.

First, a light receiving device according to a first example embodiment of the present invention will be described with reference to drawings. FIG. 1 is a perspective view of a light receiving device 1 according to the present example embodiment. FIG. 2 is a top view of the light receiving device 1. FIG. 3 is a cross-sectional view of of the light receiving device 1. FIG. 4 is a development of the light receiving device 1.

As illustrated in FIG. 1, the light receiving device 1 includes a first light guide body 11, a second light guide body 12, a light receiver 13, and a bottom plate 14.

As illustrated in FIG. 1, the first light guide body 11 is placed on the upper surface of the second light guide body 12. The first light guide body 11 is a circular cylindrical light guide body. As illustrated in FIG. 2, a sectional shape of the first light guide body 11 when cut by a horizontal plane is a circle.

As illustrated in FIG. 3, the first light guide body 11 includes a first light guide part 111 and a first directional reflection part 112.

The first light guide part 111 is a circular cylindrical light guide body with an open upper surface. In other words, the first light guide part 111 is a light guide body a sectional shape of which when cut by a horizontal plane is a circle. As illustrated in FIG. 3 and FIG. 4, the side of the first light guide part 111 is a first light receiving surface 118 of the first light guide body 11, and the lower end of the first light guide body 11 is a first emitting end 119. For example, the first light guide part 111 is formed of a material transmitting signal light. For example, the first light guide part 111 can be formed of a transparent material such as glass or plastic. The material of the first light guide part 111 is not limited as long as signal light is transmitted.

The first directional reflection part 112 is formed along the inner surface of the first light guide part 111 formed in a circular cylindrical shape. A reflection surface reflecting light entering from the first light receiving surface 118 of the first light guide body 11 toward the first emitting end 119 in such a way as to satisfy a total reflection condition is formed on a surface of the first directional reflection part 112 on the first light guide part 111 side. For example, the reflection surface of the first directional reflection part 112 can be formed of a material such as metal. The material of the reflection surface of the first directional reflection part 112 is not particularly limited as long as signal light is reflected.

The first emitting end 119 is an end from which signal light propagating inside the first light guide part 111 is emitted. The signal light emitted from the first emitting end 119 enters into the second light guide body 12 from a second light receiving surface 128 being the upper surface of the second light guide body 12.

Signal light entering into the first light guide part 111 from the first light receiving surface 118 of the first light guide body 11 travels inside the first light guide part 111 toward the first emitting end 119 while satisfying a total reflection condition. The signal light passing through the inside of the first light guide part 111 and reaching the first emitting end 119 enters into the second light guide body 12 from the second light receiving surface 128 being the upper surface of the second light guide body 12.

The second light guide body 12 is placed on the undersurface of the first light guide body 11. The second light guide body 12 is a circular-ring-shaped light guide body with open ends. As illustrated in FIG. 4, one of the open ends of the second light guide body 12 is a second emitting end 129 and the other of the open ends of the second light guide body 12 is a reflection end 124. The second emitting end 129 of the second light guide body 12 is connected to a light receiving part of the light receiver 13.

As illustrated in FIG. 3, the second light guide body 12 includes a second light guide part 121 and a second directional reflection part 122.

The second light guide part 121 is a light guide body placed in a circular ring shape along the side of the bottom plate 14. As illustrated in FIG. 4, the light receiving part of the light receiver 13 is connected to the second emitting end 129 of the second light guide part 121. On the other hand, the reflection end 124 is formed at the other end of the second light guide part 121. The upper surface of the second light guide part 121 is the second light receiving surface 128 of the second light guide body 12. For example, the second light guide part 121 is formed of a material transmitting signal light. For example, the second light guide part 121 can be formed of a transparent material such as glass or plastic. The material of the second light guide part 121 is not particularly limited as long as signal light is transmitted. The second light guide part 121 may be configured with the same material as the first light guide part 111 or may be configured with a material different from that of the first light guide part 111.

As illustrated in FIG. 4, the second light guide part 121 is a light guide plate receiving the signal light emitted from the first emitting end 119 by the second light receiving surface 128. The signal light propagated inside the first light guide part 111 while satisfying a total reflection condition. The second light guide part 121 guides the signal light toward the second emitting end 129. The signal light entering from the second light receiving surface 128 of the second light guide body 12 is reflected by the second directional reflection part 122 and is guided along the circumferential direction of the second light guide part 121 while satisfying a total reflection condition. At least part of the signal light propagating inside the second light guide body 12 is emitted from the second emitting end 129 and is received by the light receiver 13.

The second directional reflection part 122 is formed along the undersurface of the second light guide part 121. A reflection structure including a reflection surface reflecting light entering from the second light receiving surface 128 of the second light guide body 12 toward the second emitting end 129 while satisfying a total reflection condition is formed on a reflection surface of the second directional reflection part 122. For example, the reflection structure can be formed of a material such as metal. The material of the reflection structure is not limited as long as signal light is reflected. The second directional reflection part 122 may be provided not only on the undersurface of the second light guide part 121 but also on the side of the second light guide part 121.

The second emitting end 129 is one of two open ends of the second light guide part 121. The second emitting end 129 is connected to the light receiving part of the light receiver 13. Light reaching the second emitting end 129 is emitted toward the light receiver 13.

The reflection end 124 is one of the two open ends of the second light guide part 121. Light reaching the reflection end 124 is reflected toward the second emitting end 129. The reflection end 124 is not particularly limited as long as signal light is reflected. The reflection end 124 may be omitted.

The light receiver 13 is placed in such a way that the light receiving part points to the second emitting end 129 of the second light guide body 12. The light receiver 13 converts signal light received by the light receiving part into an electric signal. The light receiver 13 outputs the electric signal to an unillustrated signal processing device and/or the like. For example, the light receiver 13 can be provided by an element such as a photodiode or a phototransistor. The light receiver 13 may be provided by an element other than a photodiode or a phototransistor as long as signal light can be converted into an electric signal. An electric wire and the like connected to the light receiver 13 are omitted in the present example embodiment.

The bottom plate 14 is a plate-shaped member placed inside the circular ring formed by the second light guide body 12. In other words, the second light guide body 12 is placed along the side of the bottom plate 14. A material of the bottom plate 14 is not particularly limited. The second light guide part 121 may be placed along the side of the bottom plate 14, and the second directional reflection part 122 may be placed in a range including the undersurface of the bottom plate 14. The bottom plate 14 may be omitted.

The above concludes the description of the structure of the light receiving device 1 according to the present example embodiment.

Directional Light Guide Plate

A directional light guide plate providing the first light guide body 11 and the second light guide body 12 will be described with examples.

Figure 5:
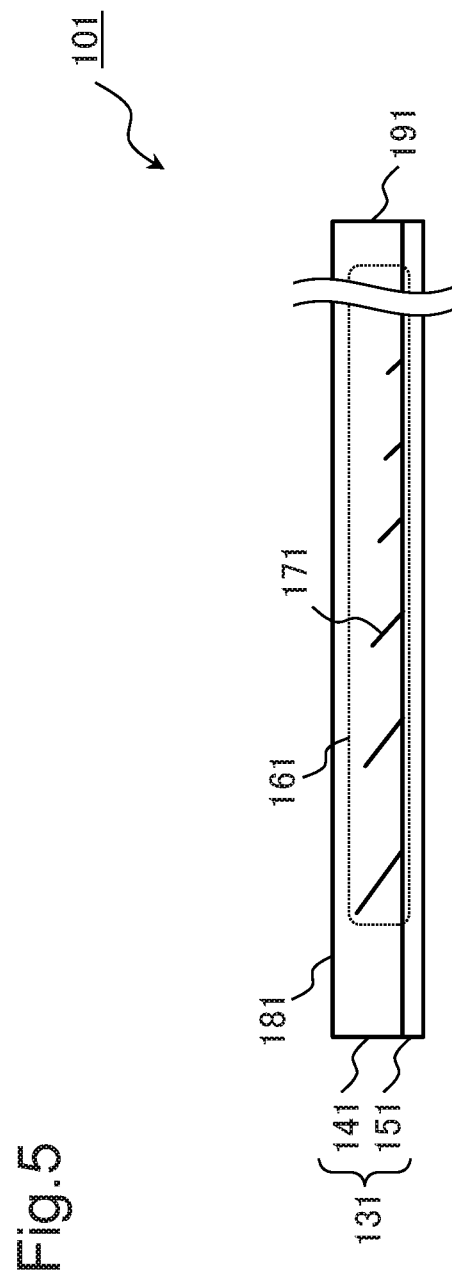
FIG. 5 is a cross-sectional view illustrating an example of a structure of a directional light guide plate providing a first light guide part and a second light guide part in the light receiving device according to the first example embodiment of the present invention.

FIG. 5 is a cross-sectional view illustrating an example of a structure of of a directional light guide plate 101. The directional light guide plate 101 includes a transparent light guide part 141 and a directional reflection part 151.

The transparent light guide part 141 is formed with a material transmitting signal light. The transparent light guide part 141 is a component equivalent to the first light guide part 111 and the second light guide part 121 in light receiving device 1. The upper surface of the transparent light guide part 141 is a light receiving surface 181 of the directional light guide plate 101. One end of the transparent light guide part 141 is an emitting end 191 from which light traveling inside the transparent light guide part 141 is emitted.

The directional reflection part 151 is a mechanism causing signal light entering from the light receiving surface 181 of the transparent light guide part 141 to reflect toward the emitting end 191. The directional reflection part 151 is a component equivalent to the first directional reflection part 112 and the second directional reflection part 122 in the light receiving device 1.

A reflection structure 161 including at least one reflection surface reflecting light entering from the light receiving surface 181 toward the emitting end 191 in such a way as to satisfy a total reflection condition is formed on the upper surface of the directional reflection part 151. FIG. 5 illustrates an example of the reflection structure 161 in which a plurality of reflecting mirrors 171 are spaced. The reflection structure 161 may be configured with an aggregate of micromirrors as illustrated in FIG. 5 but may also be configured in such a way as to wavelength-separate entering light and selectively guide signal light at a specific wavelength to the emitting end 191.

The reflection structure 161 includes at least one reflection surface reflecting signal light entering from the light receiving surface 181 toward the emitting end 191 in such a way as to satisfy a total reflection condition. The reflection structure 161 according to the present example embodiment is configured with at least one reflecting mirror 171 (also referred to as a reflection part) including a reflection surface reflecting light entering from the light receiving surface 181 toward the emitting end 191 in such a way as to satisfy a total reflection condition. The reflecting mirror 171 is formed of a material reflecting signal light. For example, the reflection structure 161 can be formed of a material such as metal. The material of the reflection structure 161 is not limited as long as signal light is reflected.

When the directional light guide plate 101 is used as the first light guide body 11, the directional light guide plate 101 is formed in a circular cylindrical shape with the transparent light guide part 141 as the outer side and the directional reflection part 151 as the inner side. The side of the circular cylindrical directional light guide plate 101 is the light receiving surface 181, and the undersurface is the emitting end 191.

When the directional light guide plate 101 is used as the second light guide body 12, the directional light guide plate 101 is formed in such a way that the directional reflection part 151 is placed along the undersurface of the transparent light guide part 141 formed in a circular ring shape with open ends. The upper surface of the transparent light guide part 141 formed in a circular ring shape is the light receiving surface 181, and either open end is the emitting end 191.

The structure in FIG. 5 can guide signal light entering from the light receiving surface 181 of the directional light guide plate 101 toward the emitting end 191.

Figure 6:
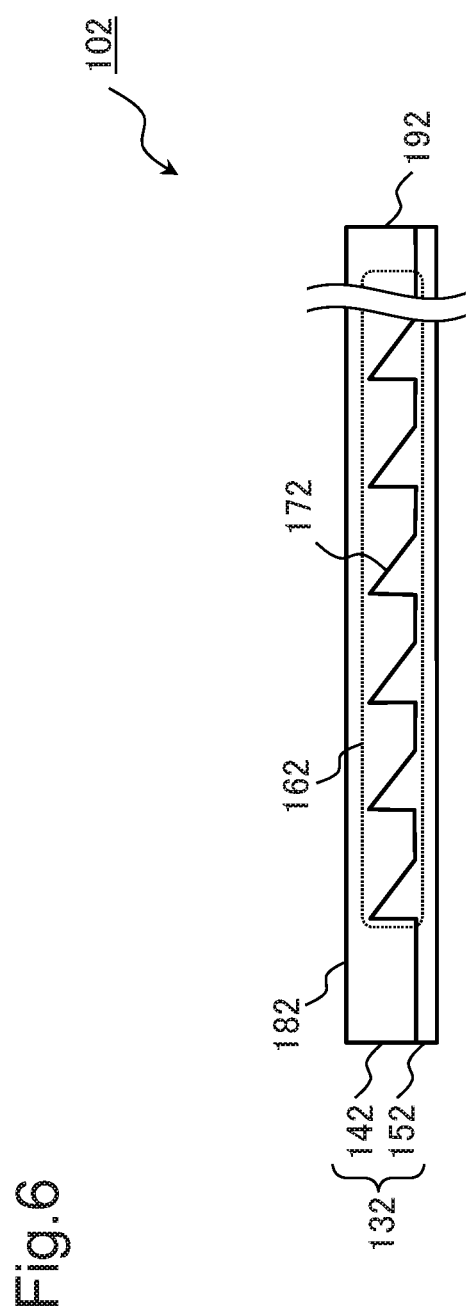
FIG. 6 is a cross-sectional view illustrating an example of a structure of a directional light guide plate providing the first light guide part and the second light guide part in the light receiving device according to the first example embodiment of the present invention.

FIG. 6 is a cross-sectional view illustrating an example of a structure of a directional light guide plate 102. The directional light guide plate 102 includes a transparent light guide part 142 and a directional reflection part 152.

The transparent light guide part 142 is formed of a material transmitting signal light. The transparent light guide part 142 is a component equivalent to the first light guide part 111 and the second light guide part 121 in the light receiving device 1. The upper surface of the transparent light guide part 142 is a light receiving surface 182 of the directional light guide plate 102. One end of the transparent light guide part 142 is an emitting end 192 from which light traveling inside the transparent light guide part 142 is emitted.

The directional reflection part 152 is a mechanism causing signal light entering from the light receiving surface 182 of the transparent light guide part 142 to reflect toward the emitting end 192. The directional reflection part 152 is a component equivalent to the first directional reflection part 112 and the second directional reflection part 122 in the light receiving device 1.

A reflection structure 162 formed in such a way that at least one reflection part 172 protrudes is formed on the upper surface of the directional reflection part 152. For example, the reflection part 172 is formed in such a way that a reflection surface thereof is placed similarly to the reflection surface of the reflecting mirror 171 of the directional reflection part 151.

The reflection structure 162 can be formed by processing the upper surface of the directional reflection part 152. It is preferable that a high-reflectance material such as metal be deposited on a surface of the reflection structure 162 in order to facilitate reflection of light. For example, the reflection structure 162 can be formed by processing the upper surface of the directional reflection part 152 by etching or the like and depositing a high-reflectance material such as metal on the upper surface. Further, for example, the reflection structure 162 can be formed by depositing a high-reflectance material such as metal on the upper surface of the directional reflection part 152 formed by injection molding or a three-dimensional printer. The structure in FIG. 6 is an example and does not limit a shape, a height, the number, and/or the like of the reflection part 172.

When the directional light guide plate 102 is used as the first light guide body 11, the directional light guide plate 102 is formed in a circular cylindrical shape with the transparent light guide part 142 as the outer side and the directional reflection part 152 as the inner side. The side of the circular cylindrical directional light guide plate 102 is the light receiving surface 182, and the undersurface is the emitting end 192.

When the directional light guide plate 102 is used as the second light guide body 12, the directional light guide plate 102 is formed in such a way that the directional reflection part 152 is placed along the undersurface of the transparent light guide part 142 formed in a circular ring shape with open ends. The upper surface of the transparent light guide part 142 formed in a circular ring shape is the light receiving surface 182, and either open end is the emitting end 192.

The structure in FIG. 6 allows formation of a reflection structure by processing the upper surface of the directional reflection part 152 and therefore can more exactly form an angle of a reflection surface than the structure in FIG. 5, and can provide a reflection surface with a more precise reflection direction.

Figure 7:
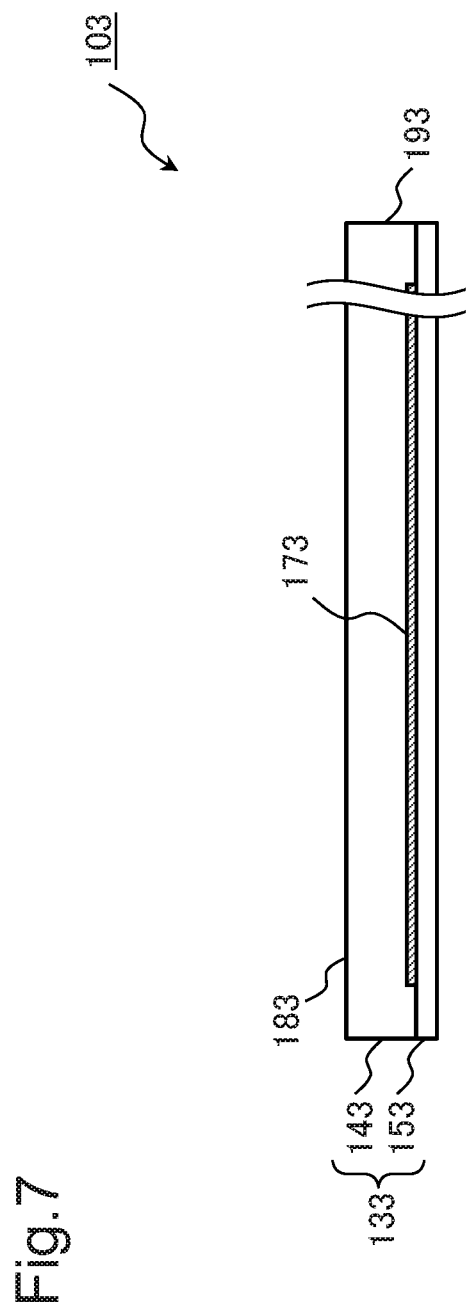
FIG. 7 is a cross-sectional view illustrating an example of a structure of a directional light guide plate providing the first light guide part and the second light guide part in the light receiving device according to the first example embodiment of the present invention.

FIG. 7 is a cross-sectional view illustrating an example of a structure of a directional light guide plate 103. The directional light guide plate 103 includes a transparent light guide part 143 and a directional reflection part 153.

The transparent light guide part 143 is formed of a material transmitting signal light. The transparent light guide part 143 is a component equivalent to the first light guide part 111 and the second light guide part 121 in the light receiving device 1. The upper surface of the transparent light guide part 143 is a light receiving surface 183 of the directional light guide plate 103. One end of the transparent light guide part 143 is an emitting end 193 from which light traveling inside the transparent light guide part 143 is emitted.

The directional reflection part 153 is a mechanism causing signal light entering from the light receiving surface 183 of the transparent light guide part 143 to reflect toward the emitting end 193. The directional reflection part 153 is a component equivalent to the first directional reflection part 112 and the second directional reflection part 122 in the light receiving device 1.

A diffraction grating array 173 is placed on a surface of the directional reflection part 153 on the transparent light guide part 143 side. The diffraction grating array 173 is formed by a reflective diffraction grating including a structure in which a plurality of gratings each of which having a height of the order of micrometers are arranged.

The diffraction grating array 173 diffracts entering light in such a way that the light entering the transparent light guide part 143 from the light receiving surface 183 of the directional reflection part 153 travels toward the emitting end 193 while satisfying a total reflection condition. For example, the diffraction grating array 173 can be provided by a blazed diffraction grating or a holographic diffraction grating. For example, it is preferable that the diffraction grating array 173 be configured by changing a grating spacing in such a way that a total reflection condition is satisfied.

When the directional light guide plate 103 is used as the first light guide body 11, the directional light guide plate 103 is formed in a circular cylindrical shape with the transparent light guide part 143 as the outer side and the directional reflection part 153 as the inner side. The side of the circular cylindrical directional light guide plate 103 is the light receiving surface 183, and the undersurface is the emitting end 193.

When the directional light guide plate 103 is used as the second light guide body 12, the directional light guide plate 103 is formed in such a way that the directional reflection part 153 is placed along the undersurface of the transparent light guide part 143 formed in a circular ring shape with open ends. The upper surface of the transparent light guide part 143 formed in a circular ring shape is the light receiving surface 183, and either open end is the emitting end 193.

The structure in FIG. 7 allows formation of a reflection structure with a low overall height and therefore can reduce the thickness of the directional light guide plate compared with the structures in FIG. 5 and FIG. 6.

The above concludes the description of the examples of a directional light guide plate providing the first light guide body 11 and the second light guide body 12. The examples in FIG. 5 to FIG. 7 are examples and do not limit a directional light guide plate providing the first light guide body 11 and the second light guide body 12 according to the present example embodiment.

As described above, the light receiving device according to the present example embodiment includes the first light guide body guiding light entering from the light receiving surface toward the emitting end and the second light guide body receiving light emitted from the first light guide body and guiding the light toward the emitting end. Then, the light receiving device according to the present example embodiment includes the light receiver receiving light emitted from the second light guide body.

The first light guide body includes at least the first light receiving surface and the first emitting end. Signal light entering from the first light receiving surface is directionally guided to the first emitting end. The second light guide body includes at least the second light receiving surface and the second emitting end, and the second light receiving surface is connected to the first emitting end of the first light guide body. Signal light entering from the second light receiving surface is directionally guided to the second emitting end. The light receiver includes the light receiving part connected to the second emitting end. The light receiver converts signal light received by the light receiving part into an electric signal.

The first light guide body is formed in a cylindrical shape with the first light receiving surface as the side, and the first emitting end is formed on either one of the upper surface and the undersurface. The second light guide body is formed in a ring shape with open ends according to the shape of the first emitting end of the first light guide body formed in a cylindrical shape.

For example, the first light guide body is formed in a circular cylindrical shape. The second light guide body is formed in a circular ring shape with open ends according to the shape of the first emitting end of the first light guide body formed in a circular cylindrical shape.

Consequently, the light receiving device according to the present example embodiment can efficiently receive spatial light without using a condensing lens.

MODIFIED EXAMPLES

Modified examples of the light receiving device according to the present example embodiment will be described with reference to drawings.

Modified Example 1

Figure 8:
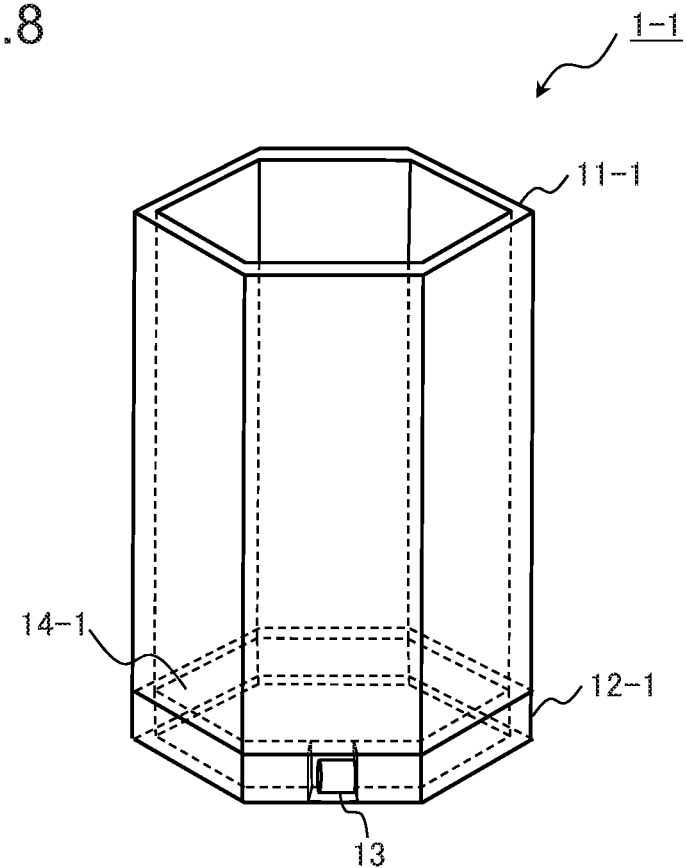
FIG. 8 is a perspective view of an example of a light receiving device according to a modified example 1 of the first example embodiment of the present invention.

FIG. 8 is a perspective view illustrating an example of a light receiving device 1-1 in a modified example 1. As illustrated in FIG. 8, the light receiving device 1-1 includes a first light guide body 11-1, a second light guide body 12-1, a light receiver 13, and a bottom plate 14-1. Shapes of the first light guide body 11-1, the second light guide body 12-1, and the bottom plate 14-1 in the light receiving device 1-1 differ from those in the light receiving device 1. The structure other than the shapes of the first light guide body 11-1, the second light guide body 12-1, and the bottom plate 14-1, the light receiving device 1-1 is similar to the light receiving device 1, and therefore detailed description thereof is omitted.

As illustrated in FIG. 8, the first light guide body 11-1 is placed on the upper surface of the second light guide body 12-1. The first light guide body 11-1 is a light guide body a sectional shape of which when cut by a horizontal plane is a hexagon. The first light guide body 11-1 is configured with a first light guide part and a first directional reflection part, similarly to the first light guide body 11 in the light receiving device 1 according to the first example embodiment.

Signal light entering into the first light guide body 11-1 from the outer side (a first light receiving surface) of the first light guide body 11-1 travels inside the first light guide body 11-1 toward the lower end (a first emitting end) of the first light guide body 11-1 while satisfying a total reflection condition. The signal light emitted from the first emitting end of the first light guide body 11-1 enters into the second light guide body 12-1 from the upper surface (a second light receiving surface) of the second light guide body 12-1.

The second light guide body 12-1 is placed on the undersurface of the first light guide body 11-1. The second light guide body 12-1 is a hexagonal-ring-shaped light guide body with open ends. The second light guide body 12-1 is a light guide plate receiving signal light emitted from the first light guide body 11-1 by the second light receiving surface and guiding the received signal light toward a second emitting end. The second light guide body 12-1 is configured with a second light guide part and a second directional reflection part, similarly to the second light guide body 12 in the light receiving device 1 according to the first example embodiment.

Signal light entering into the second light guide body 12-1 from the second light receiving surface being the upper surface of the second light guide body 12-1 is guided inside the second light guide body 12-1 toward the second emitting end. At least part of the signal light propagating inside the second light guide body 12-1 is emitted from the second emitting end and is received by the light receiver 13.

The bottom plate 14-1 is a plate-shaped member placed inside the hexagonal ring formed by the second light guide body 12-1. In other words, the second light guide body 12-1 is placed along the side of the bottom plate 14-1. The bottom plate 14 may be omitted.

As described above, the sectional shape of the first light guide body in the light receiving device in this modified example when cut by a horizontal plane is a hexagon. The sectional shape when the first light guide body in the light receiving device according to the present example embodiment is cut by a horizontal plane may form a polygon other than a hexagon. Specifically, the sectional shape when the first light guide body in the light receiving device according to the present example embodiment is cut by a horizontal plane may form any polygon including a hexagon without being limited to a circle as long as signal light traveling inside the first light guide body is guided to the second light guide body. Further, a shape and/or an area of the section when the first light guide body in the light receiving device according to the present example embodiment is cut by a horizontal plane may vary with a cutting position as long as signal light traveling inside the first light guide body can be guided to the second light guide body.

The second light guide body in the light receiving device according to the present example embodiment is a polygonal-ring-shaped light guide body with open ends, the light guide body being formed according to the shape of the first light guide body. Signal light emitted from the emitting end of the second light guide body is received by the light receiving part of the light receiver.

For example, the first light guide body is formed in a polygonal cylindrical shape. The second light guide body is formed in a polygonal ring shape with open ends according to the shape of the first emitting end of the first light guide body formed in a polygonal cylindrical shape.

Modified Example 2

Figure 9:
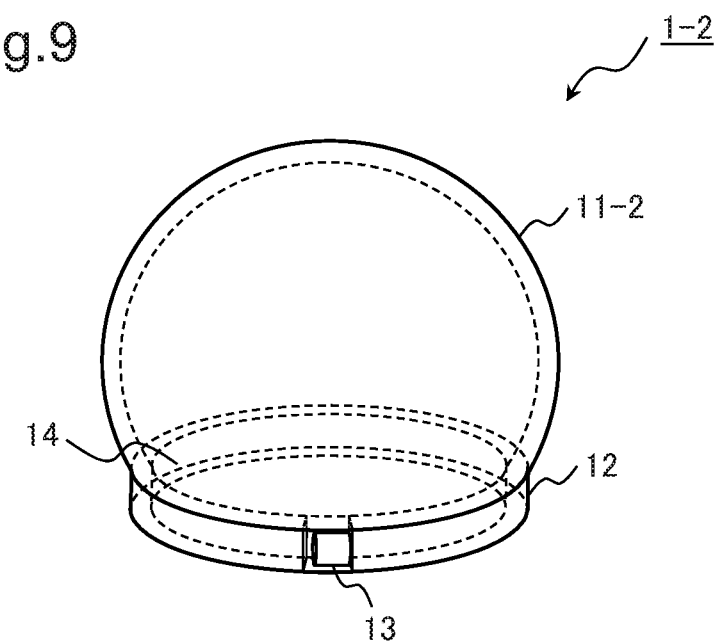
FIG. 9 is a perspective view of an example of a light receiving device according to a modified example 2 of the first example embodiment of the present invention.

FIG. 9 is a perspective view illustrating an example of a light receiving device 1-2 in a modified example 2. As illustrated in FIG. 9, the light receiving device 1-2 differs from the light receiving device 1 in placing a first light guide body 11-2 in a shape of the surface part of a solid acquired by cutting a sphere by a plane (hereinafter referred to as a spherical crown shape) on a second light guide body 12. The structure other than the first light guide body 11-2 is similar to that of the light receiving device 1, and therefore detailed description thereof is omitted.

The first light guide body 11-2 is placed on the upper surface of the second light guide body 12. The first light guide body 11-2 is a spherical-crown-shaped light guide body. The surface of the first light guide body 11-2 is a first light receiving surface. The end of the undersurface of the first light guide body 11-2 is a first emitting end. The first light guide body 11-2 is configured with a first light guide part and a first directional reflection part, similarly to the first light guide body 11 in the light receiving device 1 according to the first example embodiment.

Signal light entering into the first light guide body 11-2 from the first light receiving surface of the first light guide body 11-2 travels inside the first light guide body 11-2 toward the first emitting end. Signal light passing through the inside of the first light guide body 11-2 and being emitted from the first emitting end enters into the second light guide body 12 from the upper surface (a second light receiving surface) of the second light guide body 12.

As described above, the light receiving device in this modified example includes the spherical-crown-shaped first light guide body the surface of which is the first light receiving surface. The second light guide body is formed in a circular ring shape with open ends according to the shape of the first emitting end positioned at the bottom of the first light guide body.

Consequently, the light receiving device in this modified example can receive signal light arriving from various angles. The first light guide body in the light receiving device in this modified example may have a shape of the surface of a solid acquired by cutting any closed surface by at least one plane, without being limited to a spherical crown shape.

Modified Example 3

Figure 10:
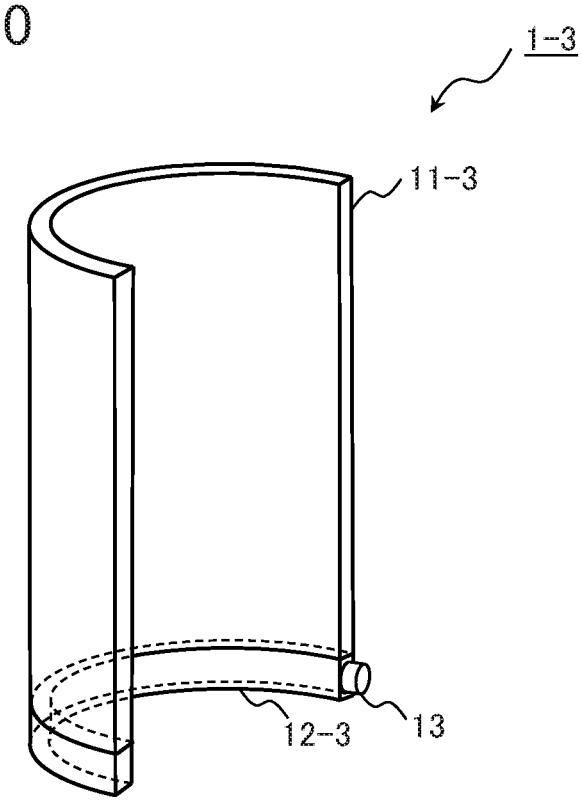
FIG. 10 is a perspective view of an example of a light receiving device according to a modified example 3 of the first example embodiment of the present invention.

FIG. 10 is a perspective view illustrating an example of a light receiving device 1-3 in a modified example 3. As illustrated in FIG. 10, the light receiving device 1-3 has a the first light guide body 11-3 having a shape that is the first light guide body 11 according to the first example embodiment cut by a plane parallel to a generating line. The light receiving device 1-3 differs from the light receiving device 1 in placing a second light guide body 12-3 formed according to a sectional shape of a first light guide body 11-3 on the undersurface of the first light guide body 11-3. In other words, the first light guide body 11-3 has a a shape of a cylindrical surface formed when moving a segment set up perpendicularly on a second light receiving surface of the second light guide body 12-3 curvilinearly formed on a plane, along the curvilinear shape of the second light guide body 12-3. While the light receiving device 1-3 illustrated in FIG. 10 has a structure not including a bottom plate, the device may have a structure including a bottom plate.

The first light guide body 11-3 is placed on the upper surface of the second light guide body 12-3. The first light guide body 11-3 is a light guide body having a shape acquired by cutting the first light guide body 11 according to the first example embodiment by a plane parallel to a generating line. The first light guide body 11-3 is configured with a first light guide part and a first directional reflection part, similarly to the first light guide body 11 in the light receiving device 1 according to the first example embodiment. Either of the two sides of the first light guide body 11-3 may be assumed as a first light receiving surface. The first directional reflection part is formed on a plane opposite to the first light receiving surface.

Signal light entering into the first light guide body 11-3 from the first light receiving surface of the first light guide body 11-3 travels inside the first light guide body 11-3 toward a first emitting end. The signal light passing through the inside of the first light guide body 11-3 and being emitted from the first emitting end enters into the second light guide body 12-3 from the upper surface (a second light receiving surface) of the second light guide body 12-3.

The second light guide body 12-3 is placed on the undersurface of the first light guide body 11-3. The second light guide body 12-3 has a shape matching the shape of the undersurface of the first light guide body 11-3. The upper surface of the second light guide body 12-3 is the second light receiving surface. The second light guide body 12-3 directionally reflects signal light entering from the second light receiving surface toward a second emitting end. The signal light emitted from the second emitting end is received by a light receiving part of a light receiver 13.

As described above, the light receiving device in this modified example includes the first light guide body having at least either of the two sides of a cylinder formed by cutting a circular cylinder by a plane parallel to a generating line as the first light receiving surface. The second light guide body is formed according to the shape of the first light guide body. The light receiving device in this modified example can efficiently receive spatial light without using a condensing lens. Further, a structure capable of receiving signal light by both surfaces of the first light guide body as is the case with the modified example 3 can more efficiently receive spatial light.

The first light guide body in this modified example has a shape of a cylindrical surface formed when moving a segment set up perpendicularly on the second light receiving surface of the second light guide body curvilinearly formed on a plane, along the curvilinear shape of the second light guide body. The first light guide body according to the first example embodiment has a cylindrical surface shape when the second light guide body is formed in a circular ring shape. The first light guide body in the modified example 1 has a cylindrical surface shape when the second light guide body is formed in a hexagonal ring shape.

In other words, the second light guide body is curvilinearly formed. The first light guide body has a shape of a cylindrical surface formed when a segment set up perpendicularly on the second light receiving surface is moved along the shape of the second light guide body.

SECOND EXAMPLE EMBODIMENT

Figure 11:
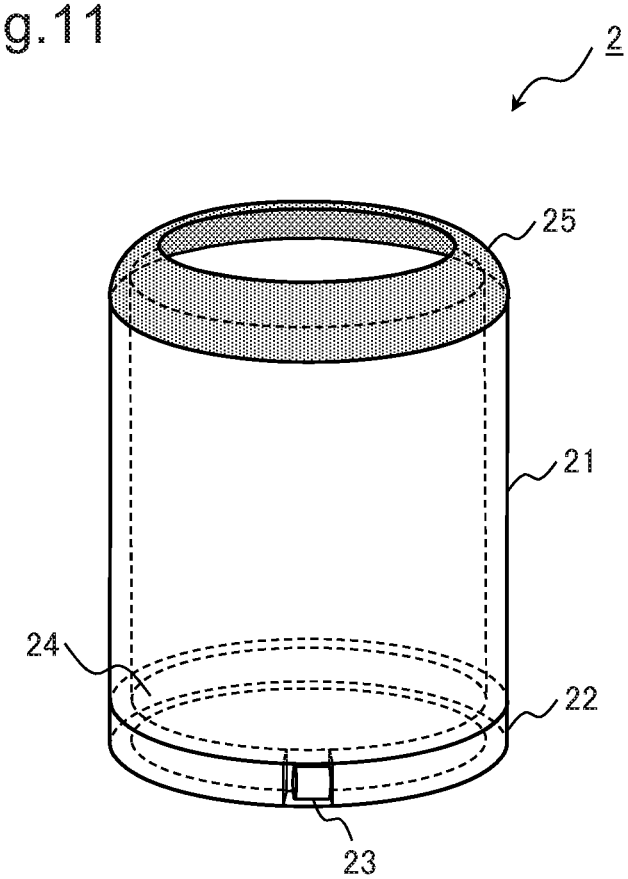
FIG. 11 is a perspective view of an example of a light receiving device according to a second example embodiment of the present invention.
Figure 12:
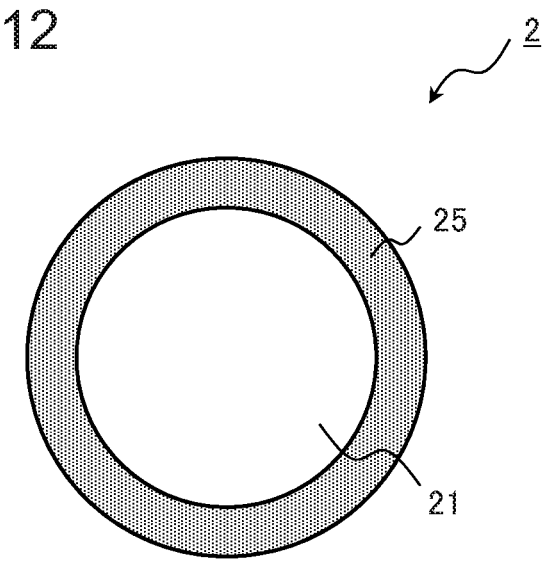
FIG. 12 is a top view of the example of the light receiving device according to the second example embodiment of the present invention.
Figure 13:
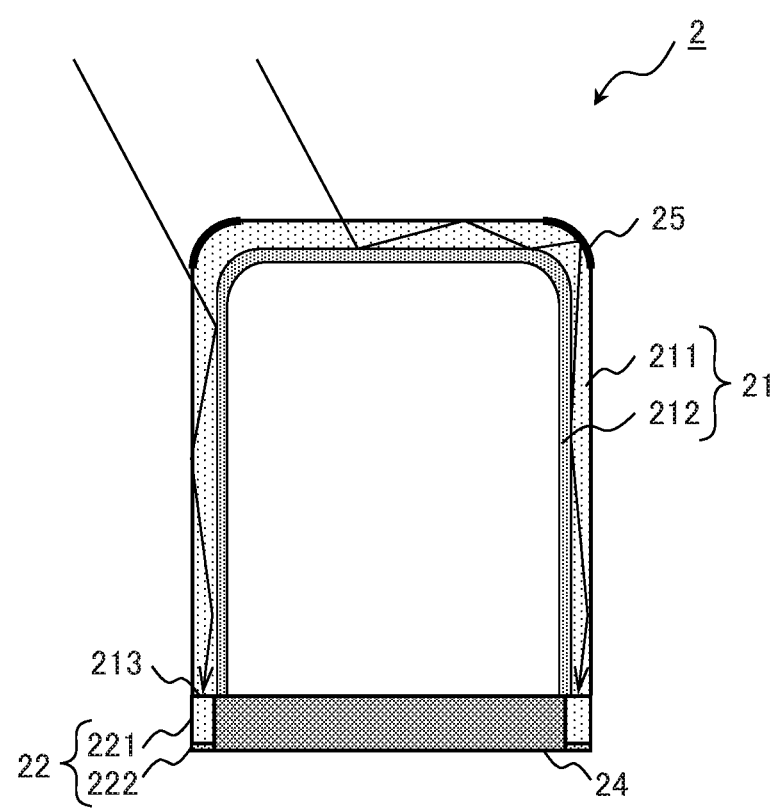
FIG. 13 is a cross-sectional view of the example of the light receiving device according to the second example embodiment of the present invention.

Next, a light receiving device according to a second example embodiment of the present invention will be described with reference to drawings. FIG. 11 is a perspective view of a light receiving device 2 according to the present example embodiment. FIG. 12 is a top view of the light receiving device 2. FIG. 13 is a cross-sectional view of the light receiving device 2. Description of a part similar to that in the first example embodiment may be omitted below.

As illustrated in FIG. 11, the light receiving device 2 includes a first light guide body 21, a second light guide body 22, a light receiver 23, a bottom plate 24, and a reflecting mirror 25.

As illustrated in FIG. 11, the first light guide body 21 is placed on the upper surface of the second light guide body 22. As illustrated in FIG. 11 to FIG. 13, the first light guide body 21 is a circular cylindrical light guide body with a closed upper surface, a sectional shape of the light guide body when cut by a horizontal plane being a circle.

As illustrated in FIG. 13, the first light guide body 21 includes a first light guide part 211 and a first directional reflection part 212.

The first light guide part 211 is a circular cylindrical light guide body with a closed upper surface. Specifically, the first light guide part 211 is a light guide body with a closed upper surface, a sectional shape of the light guide body when cut by a horizontal plane being a circle. The surface of the first light guide part 211 is a light receiving surface of the first light guide body 21. As illustrated in FIG. 13, the lower end of the first light guide body 21 is an emitting end 213. For example, the first light guide part 211 is formed of a material transmitting signal light. For example, the first light guide part 211 can be formed of a transparent material such as glass or plastic. The material of the first light guide part 211 is not limited as long as signal light is transmitted.

The first directional reflection part 212 is formed along the inner surface of the first light guide part 211 formed in a circular cylindrical shape. A reflection surface reflecting light entering from the light receiving surface of the first light guide body 21 toward the emitting end 213 in such a way as to satisfy a total reflection condition is formed on a surface of the first directional reflection part 212 on the first light guide part 211 side. For example, the reflection surface of the first directional reflection part 212 can be formed of a material such as metal. The material of the reflection surface of the first directional reflection part 212 is not limited as long as signal light is reflected.

The emitting end 213 is an end from which signal light propagating inside the first light guide part 211 is emitted.

The signal light emitted from the emitting end 213 enters into the second light guide body 22 from a light receiving surface being the upper surface of the second light guide body 22.

As illustrated in FIG. 13, signal light entering into the first light guide part 211 from the upper surface of the first light guide body 21 is reflected inside the first light guide body 21 in a horizontal direction while satisfying a total reflection condition and travels toward the side part of the first light guide body 21. The traveling direction of the signal light reaching a curved surface part linking the upper part and the side part of the first light guide body 21 is changed by a reflecting mirror 25 installed along the outer surface of the curved surface. The signal light the traveling direction of which is changed by the reflecting mirror 25 travels inside the first light guide part 211 toward the emitting end 213 while satisfying a total reflection condition. The signal light passing through the inside of the first light guide part 211 and being emitted from the emitting end 213 enters into the second light guide body 22 from the light receiving surface being the upper surface of the second light guide body 22.

The second light guide body 22 is placed on the undersurface of the first light guide body 21. The second light guide body 22 is a circular-ring-shaped light guide body with open ends. The second light guide body 22 is a light guide plate receiving, by the light receiving surface, signal light emitted from the first light guide body 21 and guiding the received signal light toward an emitting end, similarly to the second light guide body 12 according to the first example embodiment. The signal light entering from the light receiving surface of the second light guide body 22 is guided toward the emitting end. The signal light passing through the inside of the second light guide body 22 and being emitted from the emitting end is received by the light receiver 23.

The reflecting mirror 25 is placed along the outer surface of a curved surface between the upper part and the side part of the first light guide body 21. The reflecting mirror 25 is placed in such a way that a reflection surface thereof points to the first light guide body 21. The reflecting mirror 25 reflects, toward the emitting end 213, signal light that travels inside the light guide part being the upper part of the first light guide body 21 and reaches the curved surface linking the upper part and the side part.

The above concludes the description of the structure of the light receiving device 2 according to the present example embodiment.

As described above, according to the present example embodiment, the first light guide body is formed in a cylindrical shape with a closed upper surface, and the reflecting mirror the reflection surface of which points to the inside of the first light guide body is installed on at least part of the surface connecting the upper surface and the side. Consequently, the light receiving device according to the present example embodiment can directionally guide signal light entering from the upper surface of the first light guide body. The light receiving device according to the present example embodiment can efficiently receive signal light even in a state of putting an opaque object inside the first light guide body.

THIRD EXAMPLE EMBODIMENT

Figure 14:
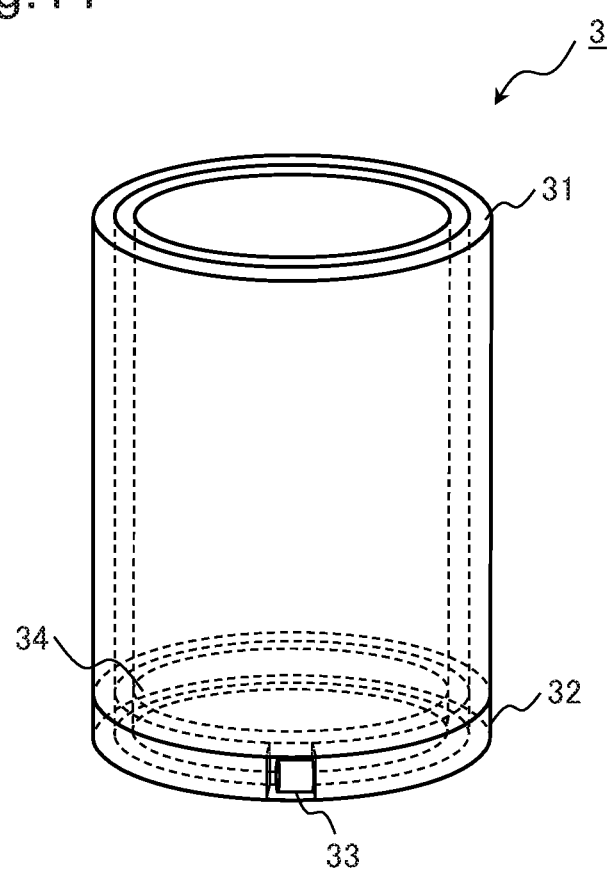
FIG. 14 is a perspective view of an example of a light receiving device according to a third example embodiment of the present invention.
Figure 15:
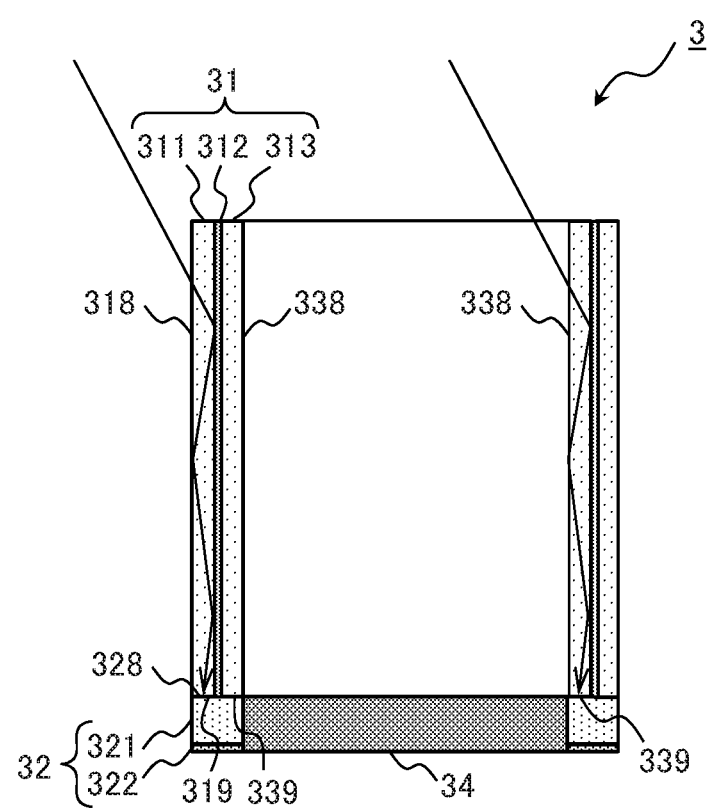
FIG. 15 is a cross-sectional view of the example of the light receiving device according to the third example embodiment of the present invention.

Next, a light receiving device according to a third example embodiment of the present invention will be described with reference to drawings. FIG. 14 is a perspective view of a light receiving device 3 according to the present example embodiment. FIG. 15 is a cross-sectional view of the light receiving device 3. Description of a part similar to that in the first example embodiment may be omitted below.

FIG. 14 is a perspective view illustrating an example of the light receiving device 3 according to the present example embodiment. FIG. 15 is a cross-sectional view of the light receiving device 3. As illustrated in FIG. 14, the light receiving device 3 includes a first light guide body 31, a second light guide body 32, a light receiver 33, and a bottom plate 34. The light receiving device 3 differs from the light receiving device 1 in a structure of the first light guide body 31. The structure of the light receiving device 3 other than the first light guide body 31 is similar to that of the light receiving device 1, and therefore detailed description thereof is omitted.

As illustrated in FIG. 14, the first light guide body 31 is placed on the upper surface of the second light guide body 32. As illustrated in FIG. 15, the first light guide body 31 includes a first light guide part 311, a first directional reflection part 312, and a third light guide part 313. The first light guide body 31 has a structure in which a first directional reflection part 312 on which directional reflection structures are formed on both surfaces is placed between two directional light guide parts.

The first light guide part 311 is a circular cylindrical light guide body with an open upper surface. In other words, the first light guide part 311 is a light guide body a sectional shape of which when cut by a horizontal plane is a circle. As illustrated in FIG. 15, the side of the first light guide part 311 is a first light receiving surface 318 of the first light guide body 31, and the lower end of the first light guide part 311 is a first emitting end 319.

The first directional reflection part 312 is formed along the inner surface of the first light guide part 311 formed in a circular cylindrical shape. A reflection surface reflecting signal light entering from the first light receiving surface 318 toward the first emitting end 319 in such a way as to satisfy a total reflection condition is formed on a surface of the first directional reflection part 312 on the first light guide part 311 side.

A third light guide part 313 is formed on the inner surface side of the first light guide body 31 formed in a circular cylindrical shape. A reflection surface is formed on a surface of the first directional reflection part 312 on the third light guide part 313 side. The reflection surface reflects the light entering from the inner surface (a third light receiving surface 338) of the third light guide part 313 formed in a circular cylindrical shape toward the lower end (a third emitting end 339) in such a way as to satisfy a total reflection condition.

The third light guide part 313 is a circular cylindrical light guide body with an open upper surface. In other words, the third light guide part 313 is a light guide body a sectional shape of which when cut by a horizontal plane is a circle. The inner surface of the third light guide part 313 is the third light receiving surface 338 of the first light guide body 31, and the lower end of the first light guide body 31 is the third emitting end 339. A material of the third light guide part 313 is similar to that of the first light guide part 311.

Signal light entering into the first light guide part 311 from the first light receiving surface 318 of the first light guide body 31 travels inside the first light guide part 311 toward the first emitting end 319 while satisfying a total reflection condition. The signal light passing through the inside of the first light guide part 311 and being emitted from the first emitting end 319 enters into the second light guide body 32 from a second light receiving surface 328 being the upper surface of the second light guide body 32.

Signal light entering into the third light guide part 313 from the third light receiving surface 338 of the first light guide body 31 travels inside the third light guide part 313 toward the third emitting end 339 while satisfying a total reflection condition. The signal light passing through the inside of the third light guide part 313 and being emitted from the third emitting end 339 enters into the second light guide body 32 from the second light receiving surface 328 being the upper surface of the second light guide body 32.

The second light receiving surface 328 of the second light guide body 32 is connected to the first emitting end 319 and the third emitting end 339 of the first light guide body 31. Signal light emitted from the first emitting end 319 and the third emitting end 339 of the first light guide body 31 enters the second light receiving surface 328 of the second light guide body 32.

As described above, the first light guide body in the light receiving device according to the present example embodiment includes the first light guide part into which signal light enters from the side and the third light guide part into which signal light enters from the inner surface. Specifically, the first light guide body includes the third light receiving surface facing the first light receiving surface, and the third light guide part including the third emitting end to which signal light entering from the third light receiving surface is guided. The second light receiving surface of the second light guide body is connected to the first emitting end and the third emitting end of the first light guide body.

Consequently, the present example embodiment can receive signal light by both surfaces of the first light guide body and can increase a signal light receiving area.

MODIFIED EXAMPLES

Modified examples of the light receiving device according to the present example embodiment will be described with reference to drawings.

Modified Example 1

Figure 16:
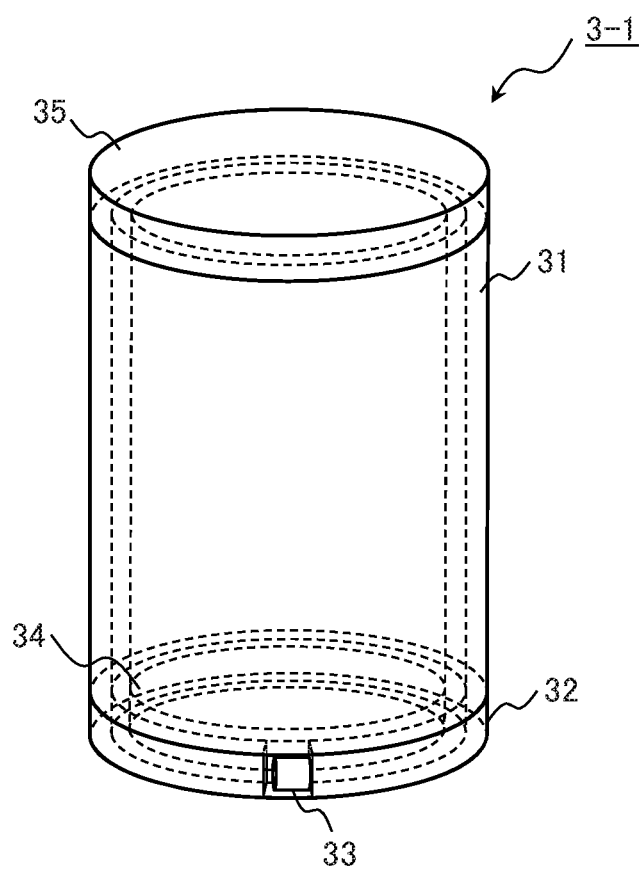
FIG. 16 is a perspective view of an example of a light receiving device according to a modified example 1 of the third example embodiment of the present invention.

FIG. 16 is a perspective view illustrating an example of a light receiving device 3-1 in a modified example 1 of the present example embodiment. As illustrated in FIG. 16, the light receiving device 3-1 differs from the light receiving device 3 according to the third example embodiment in placing a top plate 35 on the upper surface of a first light guide body 31. The structure of the light receiving device 3-1 other than the top plate 35 is similar to that of the light receiving device 3, and therefore detailed description thereof is omitted. The top plate may be placed on the upper surface of the light receiving device 1 according to the first example embodiment.

The top plate 35 (also referred to as a transparent plate) is placed on the upper surface of the first light guide body 31. The top plate 35 may be joined to the upper surface of the first light guide body 31 or may be mounted on the upper surface of the first light guide body 31. The top plate 35 is a transparent disk without a light-guiding property. Signal light passing through the top plate 35 enters into the first light guide body 31 from the inner surface (a second light receiving surface) of the first light guide body 31. The top plate 35 may be configured to fit into the upper side of the inner surface of the first light guide body 31.

For example, the top plate 35 is formed of a material transmitting signal light. For example, the top plate 35 can be formed of a transparent material such as glass or plastic. The material of the top plate 35 is not limited as long as signal light is transmitted.

As described above, the light receiving device in this modified example includes the top plate transmitting signal light on the upper surface of a first light guide part. This modified example is suitable in a case of equipping some device inside the light receiving device, a case of securing airtightness inside the light receiving device, and the like.

Modified Example 2

Figure 17:
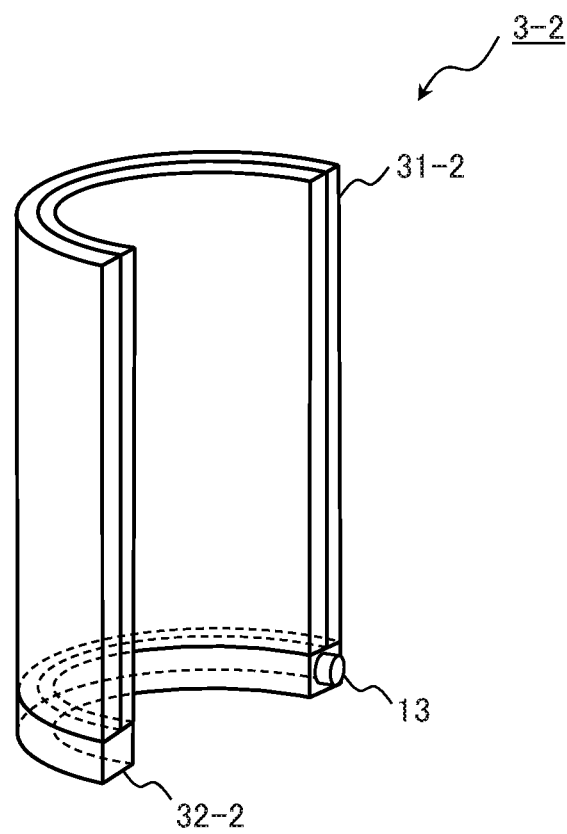
FIG. 17 is a perspective view of an example of a light receiving device according to a modified example 2 of the third example embodiment of the present invention.

FIG. 17 is a perspective view illustrating an example of a light receiving device 3-2 in a modified example 2. As illustrated in FIG. 17, the light receiving device 3-2 has a first light guide body 31-2 having a shape acquired by cutting the first light guide body 31 according to the third example embodiment by a plane parallel to a generating line. The light receiving device 3-2 differs from the light receiving device 3 in placing a second light guide body 32-3 formed according to a sectional shape of the first light guide body 31-2 on the undersurface of the first light guide body 31-2. In other words, the first light guide body 31-2 has a shape of a cylindrical surface formed when moving a segment set up perpendicularly on the upper surface of the second light guide body 32-2 curvilinearly formed on a plane, along the curvilinear shape of the second light guide body 32-2. While FIG. 17 illustrates a structure of the light receiving device 3-2 not including a bottom plate, the structure may include a bottom plate.

The first light guide body 31-2 is placed on the upper surface of the second light guide body 32-2. The first light guide body 31-2 is a light guide body having a shape acquired by cutting the first light guide body 31 according to the third example embodiment by a plane parallel to a generating line. The first light guide body 31-2 is configured with a first light guide part, a first directional reflection part, and a third light guide part, similarly to the first light guide body 31 in the light receiving device 3 according to the third example embodiment. The first directional reflection part is formed between the first light guide part and the third light guide part. The first light guide body 31-2 includes a first light receiving surface on the first light guide part side and a third light receiving surface on the second light guide part side. The first light guide body 31-2 further includes a first emitting end on the first light guide part side and a third emitting end on the second light guide part side.

Signal light entering into the first light guide body 31-2 from the first light receiving surface of the first light guide body 31-2 travels inside the first light guide body 31-2 toward the first emitting end. The signal light passing through the inside of the first light guide body 31-2 and being emitted from the first emitting end enters into the second light guide body 32-2 from a second light receiving surface being the upper surface of the second light guide body 32-2.

The signal light entering into the first light guide body 31-2 from the third light receiving surface of the first light guide body 31-2 travels inside the first light guide body 31-2 toward the third emitting end. The signal light passing through the inside of the first light guide body 31-2 and being emitted from the third emitting end enters into the second light guide body 32-2 from the second light receiving surface being the upper surface of the second light guide body 32-2.

The second light guide body 32-2 is placed on the undersurface of the first light guide body 31-2. The second light guide body 32-2 has a shape matching the shape of the undersurface of the first light guide body 31-2. The upper surface of the second light guide body 32-2 is the second light receiving surface. The second light guide body 32-2 directionally reflects signal light entering from the second light receiving surface toward a second emitting end. The signal light emitted from the second emitting end is received by a light receiving part of a light receiver 33.

As described above, the light receiving device in this modified example includes the first light guide body having both surfaces of a cylindrical surface with open sides as the light receiving surfaces. The second light guide body is formed according to the shape of the first light guide body. The light receiving device in this modified example can receive signal light by both surfaces of the first light guide body and therefore can more efficiently receive spatial light.

The first light guide body in this modified example has a shape of a cylindrical surface formed when moving a segment set up perpendicularly on the upper surface of the second light guide body curvilinearly formed on a plane, along the curvilinear shape of the second light guide body. The first light guide body according to the third example embodiment has a cylindrical surface shape when the second light guide body is formed in a circular ring shape. In other words, the first light guide body according to the present example embodiment has a shape of a cylindrical surface.

FOURTH EXAMPLE EMBODIMENT

Figure 18:
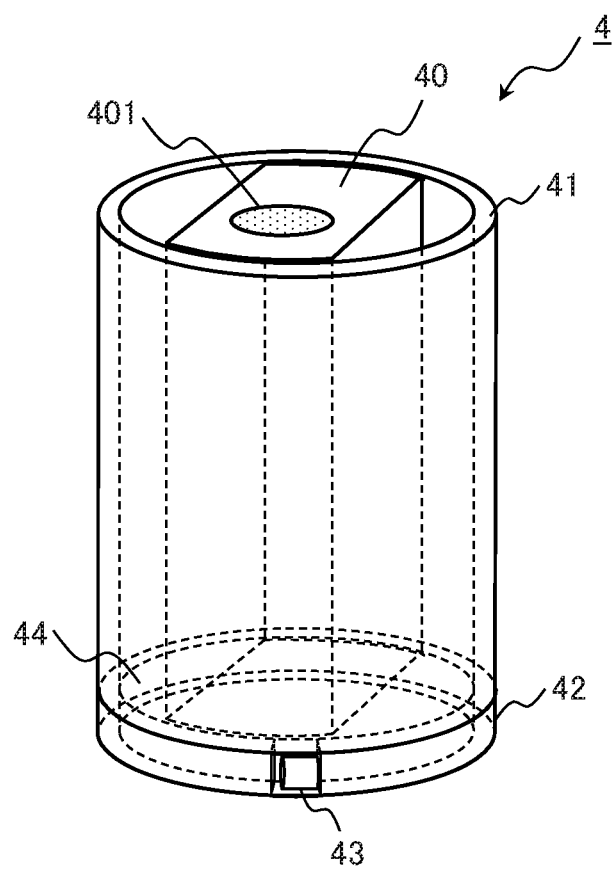
FIG. 18 is a perspective view of an example of a light transmitting and receiving device according to a fourth example embodiment of the present invention.

Next, a light transmitting and receiving device according to a fourth example embodiment of the present invention will be described with reference to drawings. The light transmitting and receiving device according to the present example embodiment has a structure in which a light transmitting device is incorporated into the light receiving device according to the first example embodiment. Description of a part similar to that in the first example embodiment may be omitted below. FIG. 18 is a perspective view of a light transmitting and receiving device 4 according to the present example embodiment.

As illustrated in FIG. 18, the light transmitting and receiving device 4 includes a light transmitting device 40, a first light guide body 41, a second light guide body 42, a light receiver 43, and a bottom plate 44. Structures of the first light guide body 41, the second light guide body 42, the light receiver 43, and the bottom plate 44 are similar to those in the light receiving device 1 according to the first example embodiment, and therefore detailed description thereof is omitted.

The light transmitting device 40 is contained inside a circular cylinder formed by the first light guide body 41 and is placed on the upper surface of the bottom plate 44. The light transmitting device 40 is a projection device projecting projection light through a projection window 401. The light transmitting device 40 is placed in such a way that the projection window 401 points upward. When the light transmitting device 40 is placed in such a way that the projection window 401 points downward, an open surface of the first light guide body 41 may be covered or the light transmitting device 40 may be fixed to the bottom plate 44, as is the case with the modified example 2 of the first example embodiment or the second example embodiment.

Figure 19:
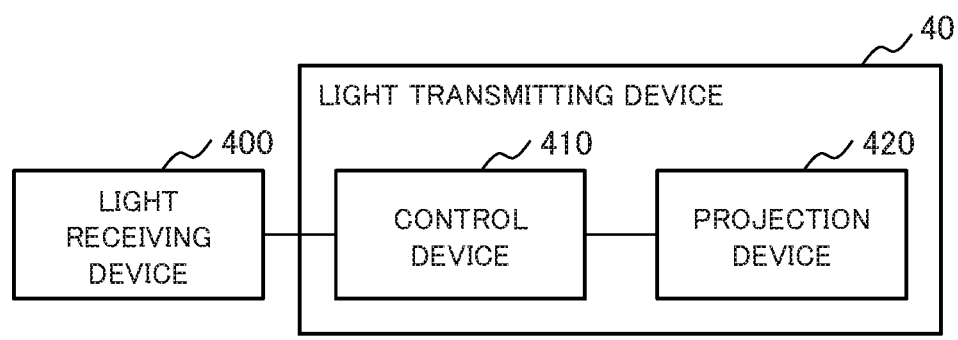
FIG. 19 is a block diagram illustrating a configuration example of a light transmitting device in the light transmitting and receiving device according to the fourth example embodiment of the present invention.

FIG. 19 is a block diagram illustrating a configuration of the light transmitting device 40. As illustrated in FIG. 19, the light transmitting device 40 includes a control device 410 and a projection device 420. The light transmitting device 40 is connected to the light receiving device 400.

The light receiving device 400 is configured with the first light guide body 41, the second light guide body 42, the light receiver 43, and the bottom plate 44. Structures of the first light guide body 41, the second light guide body 42, the light receiver 43, and the bottom plate 44 are similar to those of the first light guide body 11, the second light guide body 12, the light receiver 13, and the bottom plate 14 according to the first example embodiment, respectively. The light receiving device 400 converts signal light received by the light receiver 43 into an electric signal and outputs the electric signal to the control device 410. The light receiving device 400 may be configured to output the electric signal to a separate external system.

The control device 410 receives an electric signal from the light receiving device 400 and controls the projection device 420, based on the received electric signal.

The projection device 420 projects projection light through the projection window 401 in accordance with control by the control device 410.

The above concludes the description of an outline of the structure of the light transmitting device 40. Next, details of the configuration of the projection device 420 will be described.

Projection Device

Figure 20:
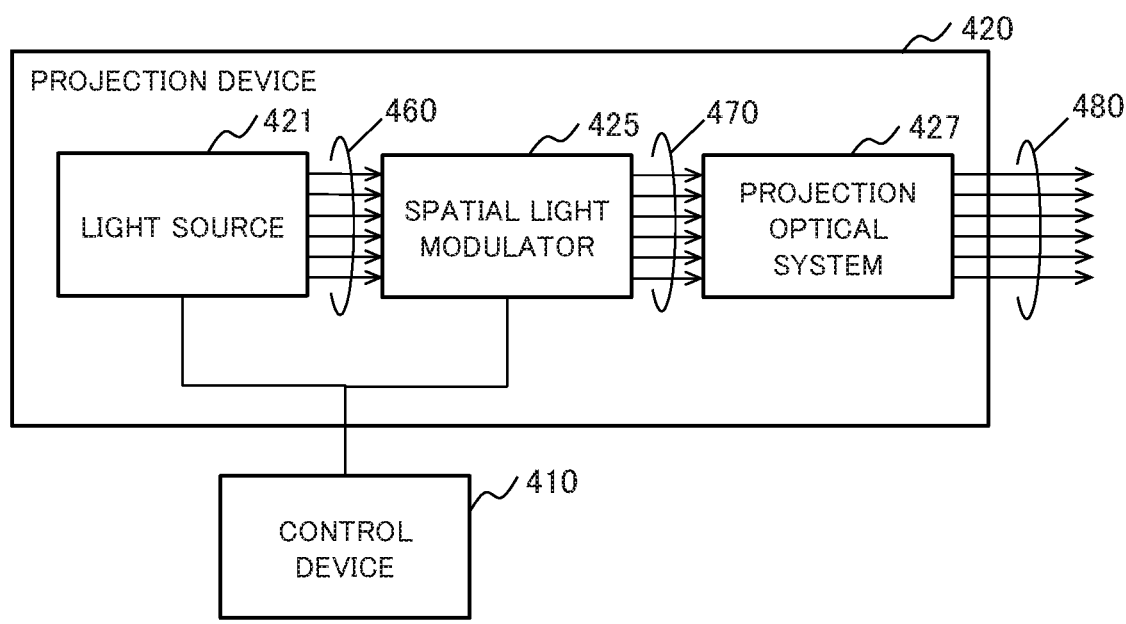
FIG. 20 is a block diagram illustrating a configuration example of a projection device included in the light transmitting device in the light transmitting and receiving device according to the fourth example embodiment of the present invention.

FIG. 20 is a block diagram illustrating a configuration of the projection device 420. As illustrated in FIG. 20, the projection device 420 includes a light source 421, a spatial light modulator 425, and a projection optical system 427. FIG. 20 is conceptual and does not accurately represent a positional relation between components, a projection direction of light, and the like.

The light source 421 emits parallel light 460 at a specific wavelength. For example, a laser light source may be used as the light source 421. Normally, the light source 421 is configured to emit light in the visible region. The light source 421 may be configured to emit light in a region other than the visible region, such as the infrared region or the ultraviolet region. The light source 421 may be a light source emitting light other than laser light, such as a light emitting diode, an incandescent lightbulb, or a discharge tube.

For example, when the light source 421 is configured to emit light at a plurality of wavelengths, a color of the projection light can be changed by changing the wavelength of the light emitted from the light source 421. When the light source 421 is configured to emit light beams at different wavelengths simultaneously, an image composed of a plurality of colors can be displayed.

Figure 21:
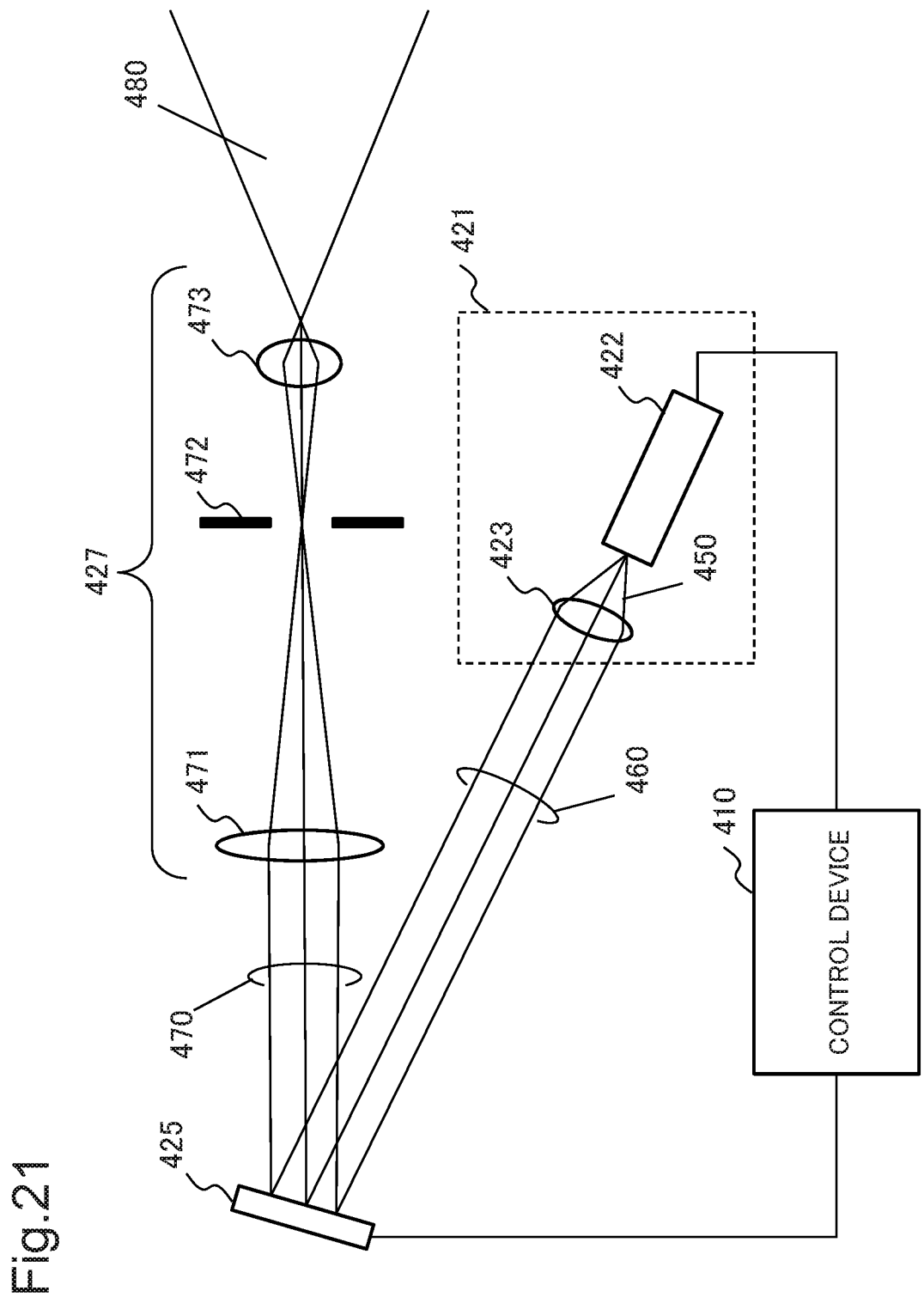
FIG. 21 is a block diagram illustrating a configuration example of an optical system of the projection device included in the light transmitting device in the light transmitting and receiving device according to the fourth example embodiment of the present invention.

FIG. 21 is a schematic diagram for illustrating an optical system of the projection device 420.

As illustrated in FIG. 21, the light source 421 includes an emitting part 422 emitting laser light 450 at a specific wavelength and a collimator 423 converting the laser light 450 emitted from the emitting part 422 into parallel light 460. The laser light 450 emitted from the emitting part 422 is converted into the parallel light 460 by the collimator 423 and enters within a surface of a display part of the spatial light modulator 425.

As illustrated in FIG. 21, an incidence angle of the parallel light 460 relative to the display part of the spatial light modulator 425 is set to be non-perpendicular, according to the present example embodiment. In other words, an emission axis of the parallel light 460 emitted from the light source 421 is set to be diagonal to the display part of the spatial light modulator 425, according to the present example embodiment. By setting the emission axis of the parallel light 460 diagonal to the display part of the spatial light modulator 425, the parallel light 460 can enter the display part of the spatial light modulator 425 without using a beam splitter, and therefore efficiency can be improved.

The spatial light modulator 425 is controlled by the control device 410 and displays, on the own display part, a pattern for displaying a desired image on a projection surface. The parallel light 460 is projected on the display part of the spatial light modulator 425 in a state of a pattern for displaying a desired image being displayed on the display part, according to the present example embodiment. Reflected light (modulated light 470) of the parallel light 460 projected on the display part of the spatial light modulator 425 travels toward the projection optical system 427.

A plurality of reflection regions (corresponding to pixels) an optical characteristic of which, such as a refractive index, can be changed are arranged in an array on the display part of the spatial light modulator 425. By controlling the optical characteristic of each pixel of the display part, the spatial light modulator 425 can display a desired pattern on the display part. When light is projected in a state of a pattern being displayed on the display part of the spatial light modulator 425, modulated light a spatial distribution of which is modulated according to the optical characteristic of a reflection part is emitted. For example, a modulator modulating a spatial distribution such as a phase, amplitude, strength, a polarization state, and/or a propagation direction of light can be used as the spatial light modulator 425.

For example, the spatial light modulator 425 can be provided by a phase-modulation type spatial light modulation element modulating a phase of the entering parallel light 460. A phase-modulation type spatial light modulator 425 is focus-free and therefore does not need to change a focus according to a distance even when projecting light on display regions set with a plurality of projection distances. An example of using the phase-modulation type spatial light modulator 425 will be described below.

A phase image also covering an image to be displayed on the projection surface is displayed on the display part of the phase-modulation type spatial light modulator 425. The phase image is a pattern in which phase distributions relating to an image to be displayed on the projection surface are placed in a tiled manner. In this case, the modulated light 470 reflected at the display region of the spatial light modulator 425 becomes an image in which kinds of diffraction gratings form an aggregate, and an image is formed in such a way that light beams diffracted by the diffraction gratings are condensed.

For example, the spatial light modulator 425 is provided by a spatial light modulation element using a ferroelectric liquid crystal, a homogeneous liquid crystal, or a homeotropic liquid crystal. Specifically, the spatial light modulator 425 can be provided by a liquid crystal on silicon (LCOS). The spatial light modulator 425 may also be provided by a micro electro mechanical system (MEMS).

Use of the phase-modulation type spatial light modulator 425 enables concentration of energy on line parts constituting an image, by successively changing a region on which projection light is projected. Consequently, the phase-modulation type spatial light modulator 425 can more brightly display an image compared with a method of projecting light on the entire display region assuming the same output from the light source.

The projection optical system 427 is an optical system projecting the modulated light 470 modulated by the spatial light modulator 425 as projection light 480. The modulated light 470 emitted from the spatial light modulator 425 is projected as the projection light 480 by the projection optical system 427.

As illustrated in FIG. 21, the projection optical system 427 includes a Fourier transform lens 471, an aperture 472, and a projection lens 473. Any of the components of the projection optical system 427 may be omitted as long as an image can be displayed in a projection range.

The Fourier transform lens 471 is an optical lens forming, at a nearby focus position, an image formed when the reflected light (modulated light 470) from the display part of the spatial light modulator 425 is projected at infinity. In the example in FIG. 21, a focus is formed at a position of the aperture 472.

The aperture 472 has a function of shading higher order light contained in light converged by the Fourier transform lens 471 and specifying a display region. An opening of the aperture 472 is opened smaller than an outer periphery of the display region at the position of the aperture 472 and is installed in such a way as to obstruct a peripheral region of an image at the position of the aperture 472. For example, the opening of the aperture 472 is formed rectangularly or circularly. It is preferable that the aperture 472 be installed at a focus position of the Fourier transform lens 471 but the position of the aperture 472 may deviate from the focus position as long as the function of erasing higher order light is exhibited.

The projection lens 473 is an optical lens magnifying and projecting light converged by the Fourier transform lens 471. The projection lens 473 projects the projection light 480 in such a way that an image relating to a phase distribution displayed on the display part of the spatial light modulator 425 is formed on the projection surface.

The above concludes the description of the configuration of the projection device 420. Next, details of the configuration of the control device 410 will be described.

Control Device

Figure 22:
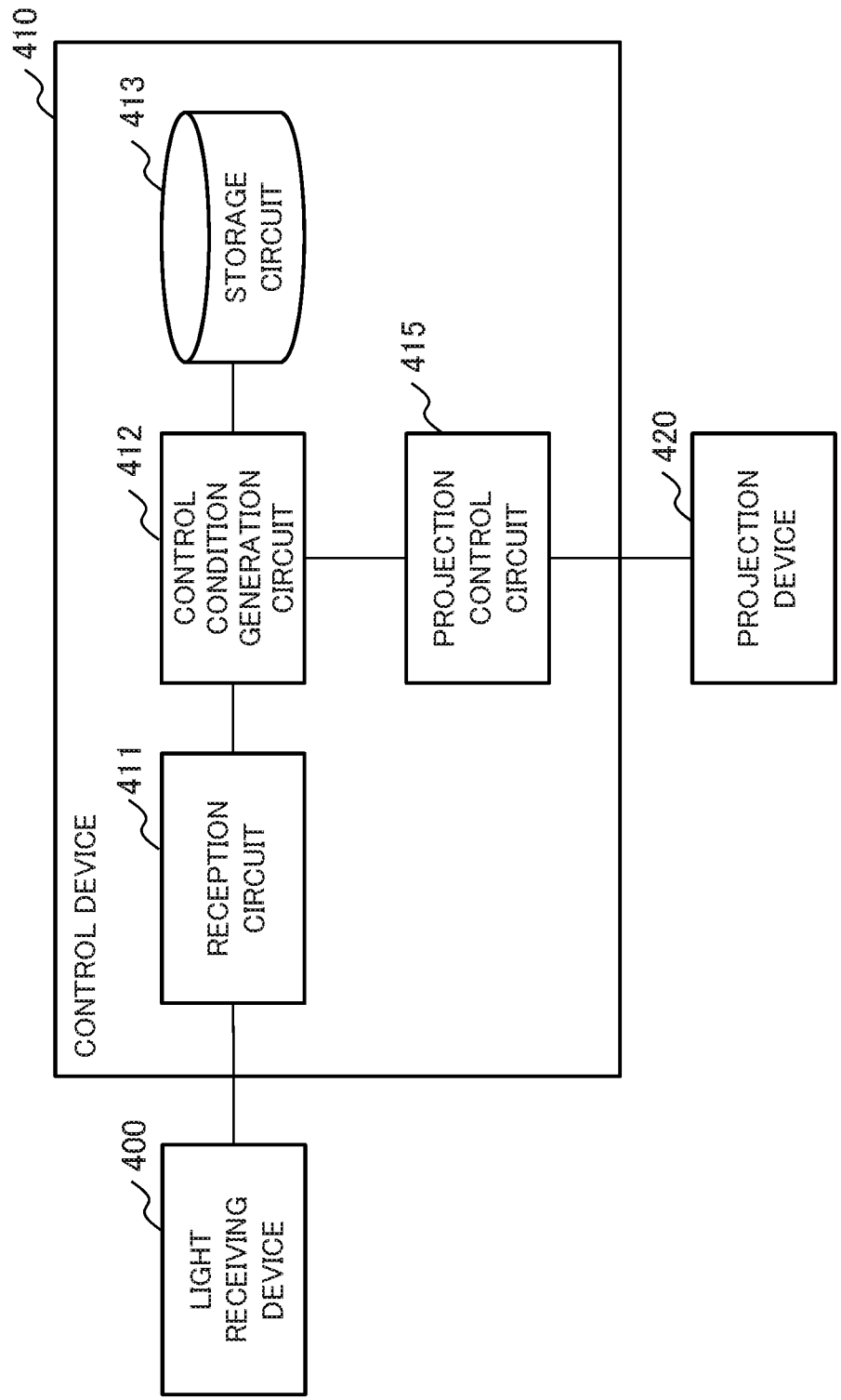
FIG. 22 is a block diagram illustrating a configuration example of a control device included in the light transmitting device in the light transmitting and receiving device according to the fourth example embodiment of the present invention.

FIG. 22 is a block diagram illustrating a configuration of the control device 410. As illustrated in FIG. 22, the control device 410 includes a reception circuit 411, a control condition generation circuit 412, a storage circuit 413, and a projection control circuit 415.

The reception circuit 411 receives an electric signal from the light receiving device 400. The reception circuit 411 outputs the received electric signal to the control condition generation circuit 412.

The control condition generation circuit 412 acquires a pattern relating to an image to be displayed on the projection surface from the storage circuit 413, based on an electric signal acquired from the reception circuit 411. When the spatial light modulator 425 is configured with a phase-modulation type element, a pattern to be displayed on the display part of the spatial light modulator 425 is a phase distribution relating to the image to be displayed on the projection surface.

The control condition generation circuit 412 generates a control condition for projecting a desired image at a proper timing. The control condition includes a modulation element control condition for displaying a pattern relating to the desired image on the display part of the spatial light modulator 425 and a light source control condition for projecting projection light at the proper timing. The control condition generation circuit 412 outputs the control condition including the modulation element control condition and the light source control condition to the projection control circuit 415.

The storage circuit 413 stores a pattern relating to a desired image. When the parallel light 460 is projected on the display part of the spatial light modulator 425 in a state of the pattern stored in the storage circuit 413 being displayed on the display part, the modulated light 470 for forming an image relating to the pattern is emitted.

The projection control circuit 415 acquires a control condition including a modulation element control condition and a light source control condition from the control condition generation circuit 412.

The projection control circuit 415 controls an ON/OFF state of a power source and drive voltage of the emitting part 422, based on the light source control condition included in the control condition. By the power source of the emitting part 422 turning ON/OFF in accordance with control by the projection control circuit 415, a desired image can be displayed on the projection surface at a proper timing.

The projection control circuit 415 causes the display part of the spatial light modulator 425 to display a pattern relating to an image to be displayed on the projection surface, based on the modulation element control condition included in the control condition. For example, when the spatial light modulator 425 is a phase-modulation type, the projection control circuit 415 drives the spatial light modulator 425 in such a way as to change a parameter determining the difference between a phase of the parallel light 460 projected on the display part of the spatial light modulator 425 and a phase of the modulated light 470 reflected at the display part.

For example, the parameter determining the difference between a phase of the parallel light 460 projected on the display part of the phase-modulation type spatial light modulator 425 and a phase of the modulated light 470 reflected at the display part is a parameter related to an optical characteristic such as a refractive index or an optical path length. For example, the projection control circuit 415 changes a refractive index of the display part by changing voltage applied to the display part of the spatial light modulator 425. Consequently, the parallel light 460 projected on the display part is appropriately diffracted based on the refractive index of the display part. In other words, a phase distribution of the parallel light 460 projected by the phase-modulation type spatial light modulator 425 is modulated according to an optical characteristic of the display part. The driving method of the spatial light modulator 425 by the projection control circuit 415 is not limited to the above.

The above concludes the description of the configuration of the control device 410.

As described above, the configuration according to the present example embodiment includes the light receiving device according to the first example embodiment incorporated with the light transmitting device. The light transmitting device according to the present example embodiment is equipped inside the cylinder formed by the first light guide body. The light transmitting device according to the present example embodiment receives an electric signal received from the light receiver and projects projection light based on the received electric signal.

The light transmitting device includes the projection device and the control device. The projection device includes the light source, the spatial light modulator including the display part modulating and reflecting emitted light emitted from the light source, and the projection optical system projecting reflected light from the display part of the spatial light modulator. The control device outputs a light source control condition for controlling the light source and a modulation element control condition for controlling the spatial light modulator to the projection device, based on an electric signal from the light receiver. For example, the spatial light modulator is a phase-modulation type.

The present example embodiment enables display of a desired image on the projection surface by projecting, from the light transmitting device, projection light forming an image based on an optical signal received by the light receiving device.

FIFTH EXAMPLE EMBODIMENT

Figure 23:
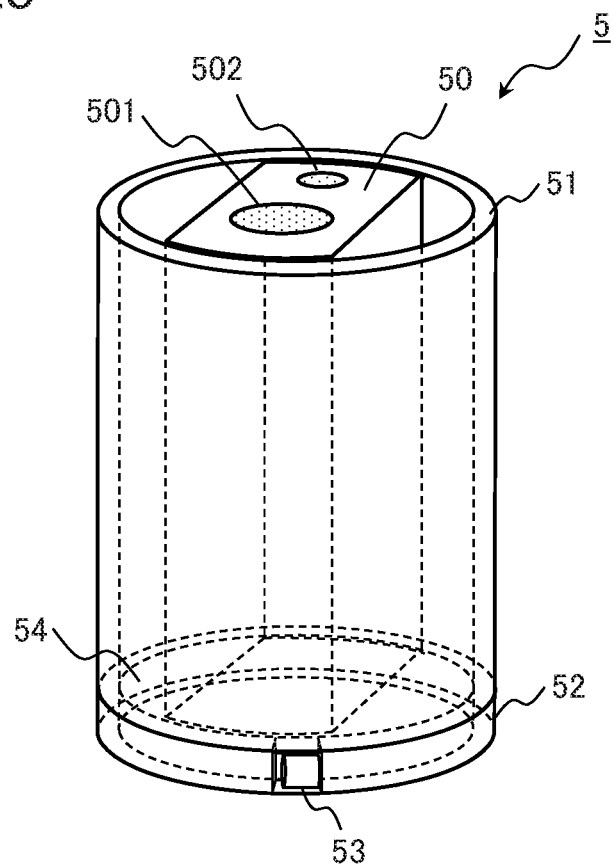
FIG. 23 is a perspective view of an example of a light transmitting and receiving device according to a fifth example embodiment of the present invention.

Next, a light transmitting and receiving device according to a fifth example embodiment of the present invention will be described with reference to drawings. The light transmitting and receiving device according to the present example embodiment has a structure acquired by incorporating an imaging device (a camera) into the light transmitting device according to the fourth example embodiment. Description of a part similar to that in the fourth example embodiment may be omitted below. FIG. 23 is a perspective view of a light transmitting and receiving device 5 according to the present example embodiment.

As illustrated in FIG. 23, the light transmitting and receiving device 5 includes a light transmitting device 50, a first light guide body 51, a second light guide body 52, a light receiver 53, and a bottom plate 54. Structures of the first light guide body 51, the second light guide body 52, the light receiver 53, and the bottom plate 54 are similar to those in the light receiving device 1 according to the first example embodiment, and therefore detailed description thereof is omitted.

The light transmitting device 50 is contained inside a circular cylinder formed by the first light guide body 51 and is mounted on the upper surface of the bottom plate 54. The light transmitting device 50 is a light transmitting device with a camera capable of projecting projection light through a projection window 501 and capturing an image through an imaging window 502. The light transmitting device 50 is placed with the projection window 501 and the imaging window 502 pointing upward. When the light transmitting device 50 is placed with the projection window 501 pointing downward, an open surface of the first light guide body 51 may be covered or the light transmitting device 50 may be fixed to the bottom plate 54 as is the case with the modified example 2 of the first example embodiment or the second example embodiment.

Figure 24:
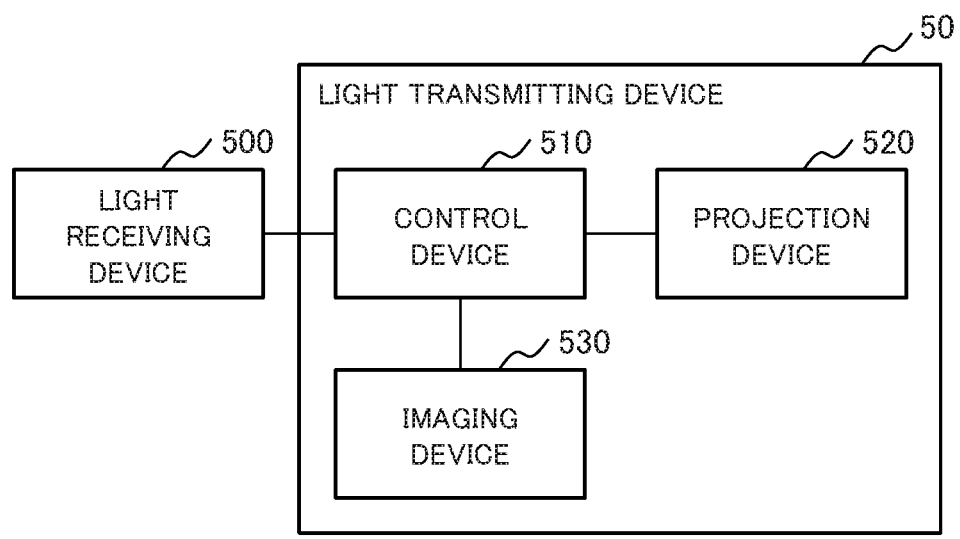
FIG. 24 is a block diagram illustrating a configuration example of a light transmitting device in the light transmitting and receiving device according to the fifth example embodiment of the present invention.

FIG. 24 is a block diagram illustrating a configuration of the light transmitting device 50. As illustrated in FIG. 24, the light transmitting device 50 includes a control device 510, a projection device 520, and an imaging device 530. The light transmitting device 50 is connected to a light receiving device 500.

The light receiving device 500 is configured with the first light guide body 51, the second light guide body 52, the light receiver 53, and the bottom plate 54. Structures of the first light guide body 51, the second light guide body 52, the light receiver 53, and the bottom plate 54 are similar to those of the first light guide body 11, the second light guide body 12, the light receiver 13, and the bottom plate 14 according to the first example embodiment, respectively. The light receiving device 500 converts signal light received by the light receiver 53 into an electric signal and outputs the electric signal to the control device 510. The light receiving device 500 may be configured to output the electric signal to a separate external system.

The control device 510 receives an electric signal from the light receiving device 500 and controls the projection device 520, based on the received electric signal.

The projection device 520 projects projection light through the projection window 501 in accordance with control by the control device 510. A configuration of the projection device 520 is similar to that of the projection device 420 according to the fourth example embodiment, and therefore detailed description thereof is omitted. Further, when a component of the projection device 520 is described, a name or a sign of a component of the projection device 420 may be used.

The imaging device 530 captures an image of an imaging region in accordance with control by the control device 510. It is preferable that an imaging region an image of which is captured by the imaging device 530 include a projection surface but the region may not include the projection surface.

For example, when an imaging region includes the projection surface, control of capturing an image of an operation performed on an image displayed on the projection surface and changing the image according to the operation can be achieved. For example, when an image including a user interface can be displayed on the projection surface by projection light from the light transmitting device 50, an interface device capable of capturing an image of an operation performed on the user interface by a user and executing processing based on the operation can be provided.

The above concludes the description of an outline of the structure of the light transmitting device 50. Next, details of the configuration of the imaging device 530 will be described.

Imaging Device

Figure 25:
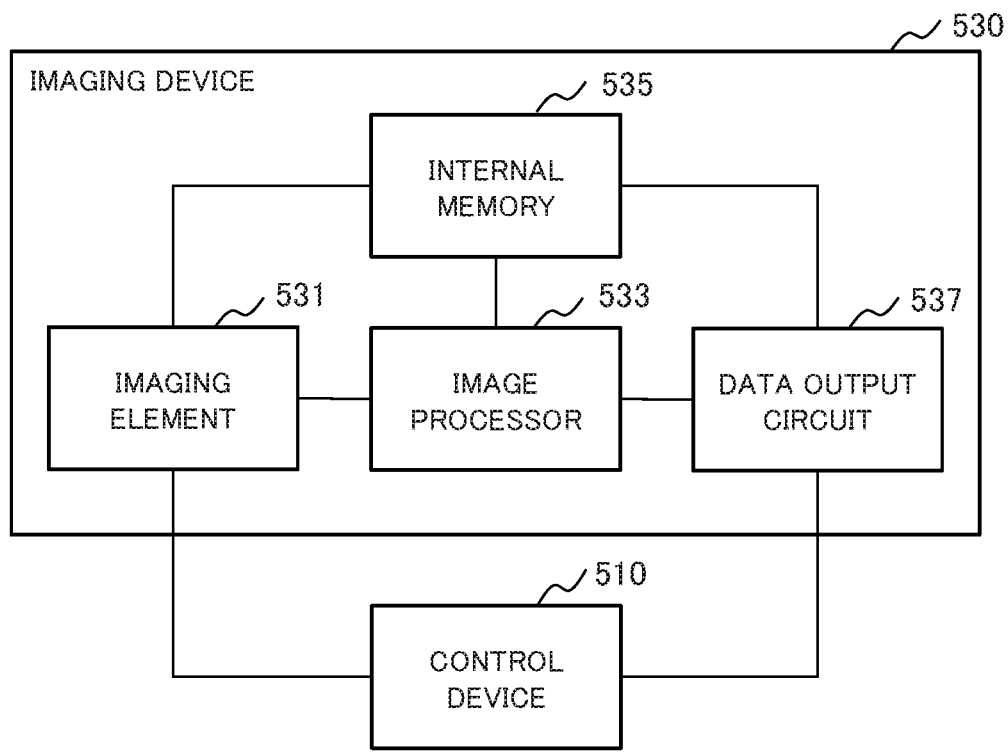
FIG. 25 is a block diagram illustrating a configuration example of an imaging device included in the light transmitting device in the light transmitting and receiving device according to the fifth example embodiment of the present invention.

FIG. 25 is a block diagram illustrating the configuration of the imaging device 530. The imaging device 530 includes an imaging element 531, an image processor 533, an internal memory 535, and a data output circuit 537. For example, the imaging device has an imaging function of a common digital camera.

The imaging element 531 is an element for capturing an image of an imaging region and acquiring captured image data of the imaging region. The imaging element 531 is a photoelectric conversion element including a semiconductor integrated circuit. For example, the imaging element 531 can be provided by a solid-state imaging element such as a charge-coupled device (CCD) or a complementary metal-oxide-semiconductor (CMOS). Normally, the imaging element 531 is provided by an element capturing light in the visible region but may be provided by an element capable of capturing and/or detecting an electromagnetic wave such as infrared rays, ultraviolet rays, X-rays, gamma rays, a radio wave, or a microwave.

The image processor 533 is an integrated circuit generating image data by performing image processing such as dark current correction, an interpolation operation, color space conversion, gamma correction, aberration correction, noise reduction, and/or image compression on captured image data captured by the imaging element 531.

The internal memory 535 is a storage element temporarily holding image information that cannot be fully processed when the image processor 533 performs image processing and processed image information. The internal memory 535 may be configured to temporarily store image information captured by the imaging element 531. The internal memory 535 may be configured with a common memory.

The data output circuit 537 outputs image data processed by the image processor 533 to the control device 510.

The above concludes the description of the configuration of the imaging device 530. Next, details of the configuration of the control device 510 will be described.

Control Device

Figure 26:
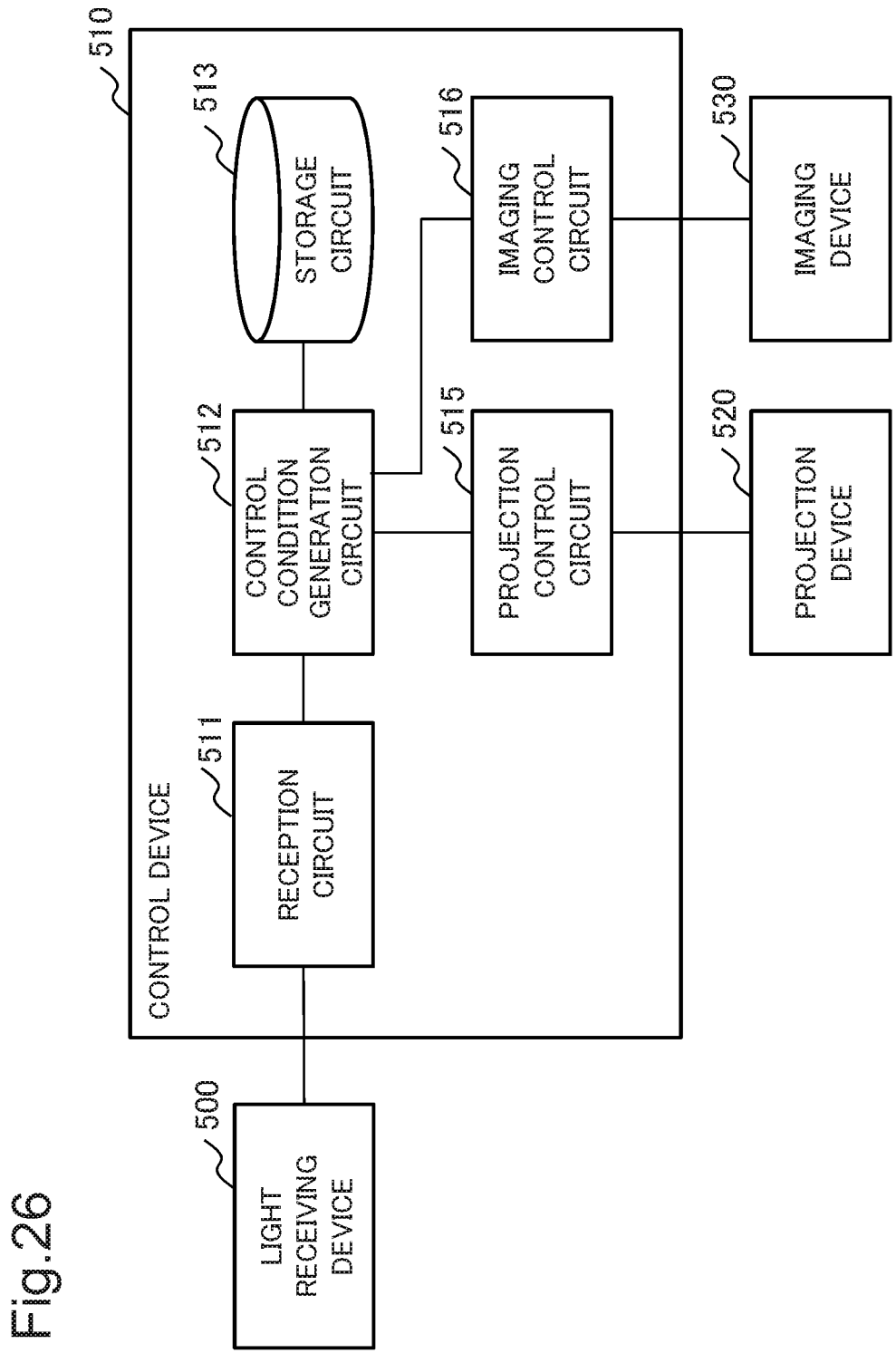
FIG. 26 is a block diagram illustrating a configuration example of a control device included in the light transmitting device in the light transmitting and receiving device according to the fifth example embodiment of the present invention.

FIG. 26 is a block diagram illustrating the configuration of the control device 510. As illustrated in FIG. 26, the control device 510 includes a reception circuit 511, a control condition generation circuit 512, a storage circuit 513, a projection control circuit 515, and an imaging control circuit 516. The reception circuit 511 is connected to the light receiving device 500. The projection control circuit 515 is connected to the projection device 520. The imaging control circuit 516 is connected to the imaging device 530.

The reception circuit 511 receives an electric signal from the light receiving device 500. The reception circuit 511 outputs the received electric signal to the control condition generation circuit 512.

The control condition generation circuit 512 acquires a pattern relating to an image to be displayed on the projection surface from the storage circuit 513, based on an electric signal acquired from the reception circuit 511.

The control condition generation circuit 512 generates a control condition for projecting a desired image at a proper timing. The control condition includes a modulation element control condition for causing a display part of a spatial light modulator 425 to display a pattern relating to the desired image and a light source control condition for projecting projection light at the proper timing. The control condition generation circuit 512 outputs the control condition including the modulation element control condition and the light source control condition to the projection control circuit 515.

The control condition generation circuit 512 also generates an imaging control condition for causing the imaging device 530 to capture an image of an imaging region, based on the electric signal acquired from the reception circuit 511. The control condition generation circuit 512 outputs the generated imaging control condition to the imaging control circuit 516.

The storage circuit 513 stores a pattern relating to a desired image.

The projection control circuit 515 acquires a control condition including a modulation element control condition and a light source control condition from the control condition generation circuit 512. The projection control circuit 515 controls an ON/OFF state of a power source and drive voltage of an emitting part 422, based on the light source control condition included in the control condition. The projection control circuit 515 also causes the display part of the spatial light modulator 425 to display a pattern relating to an image to be displayed on the projection surface, based on the modulation element control condition included in the control condition.

The imaging control circuit 516 acquires an imaging control condition from the control condition generation circuit 512. The imaging control circuit 516 causes the imaging device 530 to capture an image of an imaging region, based on the imaging control condition, and acquires captured image data captured by the imaging device 530. The imaging control circuit 516 outputs the acquired captured image data to the control condition generation circuit 512.

The above concludes the description of the details of the configuration of the control device 510.

As described above, the light transmitting and receiving device according to the present example embodiment is acquired by incorporating the imaging function into the light transmitting and receiving device according to the third example embodiment. The imaging device captures an image of a range including a projection range of the projection device. The control device outputs an imaging control condition for controlling the imaging device to the projection device, based on an electric signal from the light receiver.

Consequently, the light transmitting and receiving device according to the present example embodiment can project projection light, based on signal light received by the light receiving device, and capture an image of an imaging region of the imaging device.

An example of using the light transmitting and receiving device 5 as an interface device will be described. An operation of the light transmitting and receiving device 5 will be predominantly described below.

For example, the light transmitting and receiving device 5 causes a user interface to be displayed on the projection surface as a display image. The light transmitting and receiving device 5 captures an image of the user interface displayed as a display image. When detecting an object in the imaging region, the light transmitting and receiving device 5 specifies a position of the object. The light transmitting and receiving device 5 associates the specified position of the object with the position on the user interface and specifies where on the user interface the object points to.

For example, the light transmitting and receiving device 5 holds a table associating a position on a user interface with an operation relating to the position and a phase distribution of a display image relating to the operation. The light transmitting and receiving device 5 refers to the table and identifies an operation associated with a position of an object. When identifying an operation, the light transmitting and receiving device 5 changes a pattern to be displayed on the display part of the spatial light modulator 425 according to the operation.

As described above, the light transmitting and receiving device according to the present example embodiment achieves an interactive operation by capturing, by the imaging device, an image of an operation performed on a user interface projected from the projection device and analyzing captured image data captured at that time.

SIXTH EXAMPLE EMBODIMENT

Figure 27:
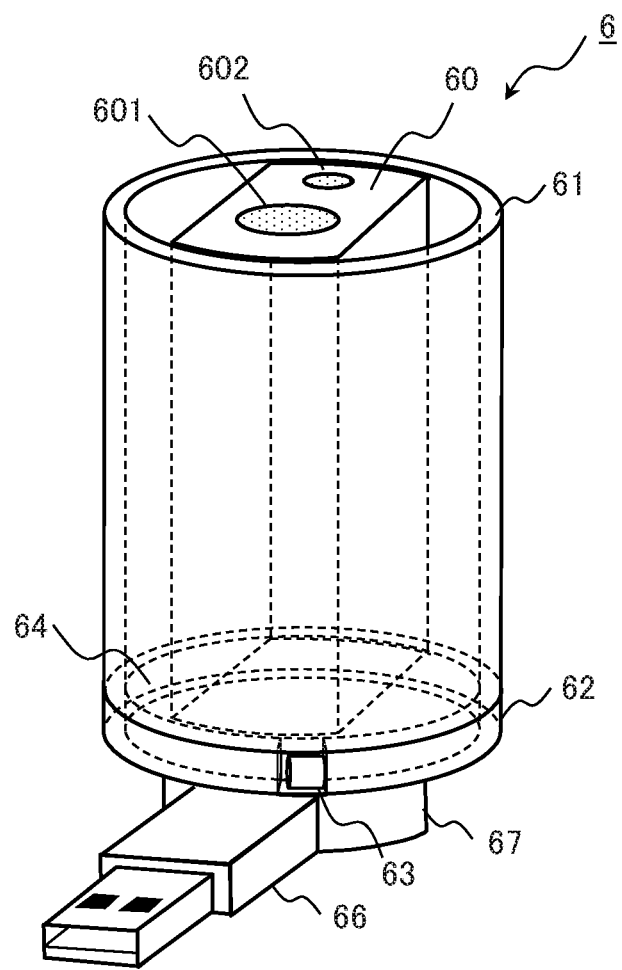
FIG. 27 is a perspective view of an example of a light transmitting and receiving device according to a sixth example embodiment of the present invention.

Next, a light receiving device according to a sixth example embodiment of the present invention will be described with reference to drawings. The light transmitting and receiving device according to the present example embodiment has a structure acquired by providing an input-output unit with the light transmitting and receiving device according to the fifth example embodiment. An example of applying a universal serial bus (USB) connector as the input-output unit according to the present example embodiment will be particularly described. Description of a part similar to that in the fifth example embodiment may be omitted below. FIG. 27 is a perspective view illustrating an example of a light transmitting and receiving device 6 according to the present example embodiment.

As illustrated in FIG. 27, the light transmitting and receiving device 6 includes a light transmitting device 60, a first light guide body 61, a second light guide body 62, a light receiver 63, a bottom plate 64, a connector 66, and a support part 67. Structures of the first light guide body 61, the second light guide body 62, the light receiver 63, and the bottom plate 64 are similar to those in the light receiving device 1 according to the first example embodiment, and therefore detailed description thereof is omitted. The light transmitting device 60 is a light transmitting device with a camera capable of projecting projection light through a projection window 601 and capturing an image through an imaging window 602. A structure of the light transmitting device 60 is similar to that of the light transmitting device 50 according to the fifth example embodiment, and therefore detailed description thereof is omitted.

The connector 66 is a terminal connected to an input-output port on an information processing device such as a computer. For example, the connector 66 is connected to the side of the support part 67. The connector 66 is connected to the control device in the light transmitting device 60 through the support part 67. The example in FIG. 27 illustrates an example of providing the connector 66 by a USB connector. For example, the connector 66 is connected to an input-output port such as a USB port.

The support part 67 is placed on the undersurface of the bottom plate 64 and is a base supporting the light transmitting device 60, the first light guide body 61, the second light guide body 62, and the bottom plate 64. The connector 66 is connected to the side of the support part 67.

The above concludes the description of an outline of the structure of the light transmitting and receiving device 6. Next, details of the configuration of the control device 610 will be described.

Control Device

Figure 28:
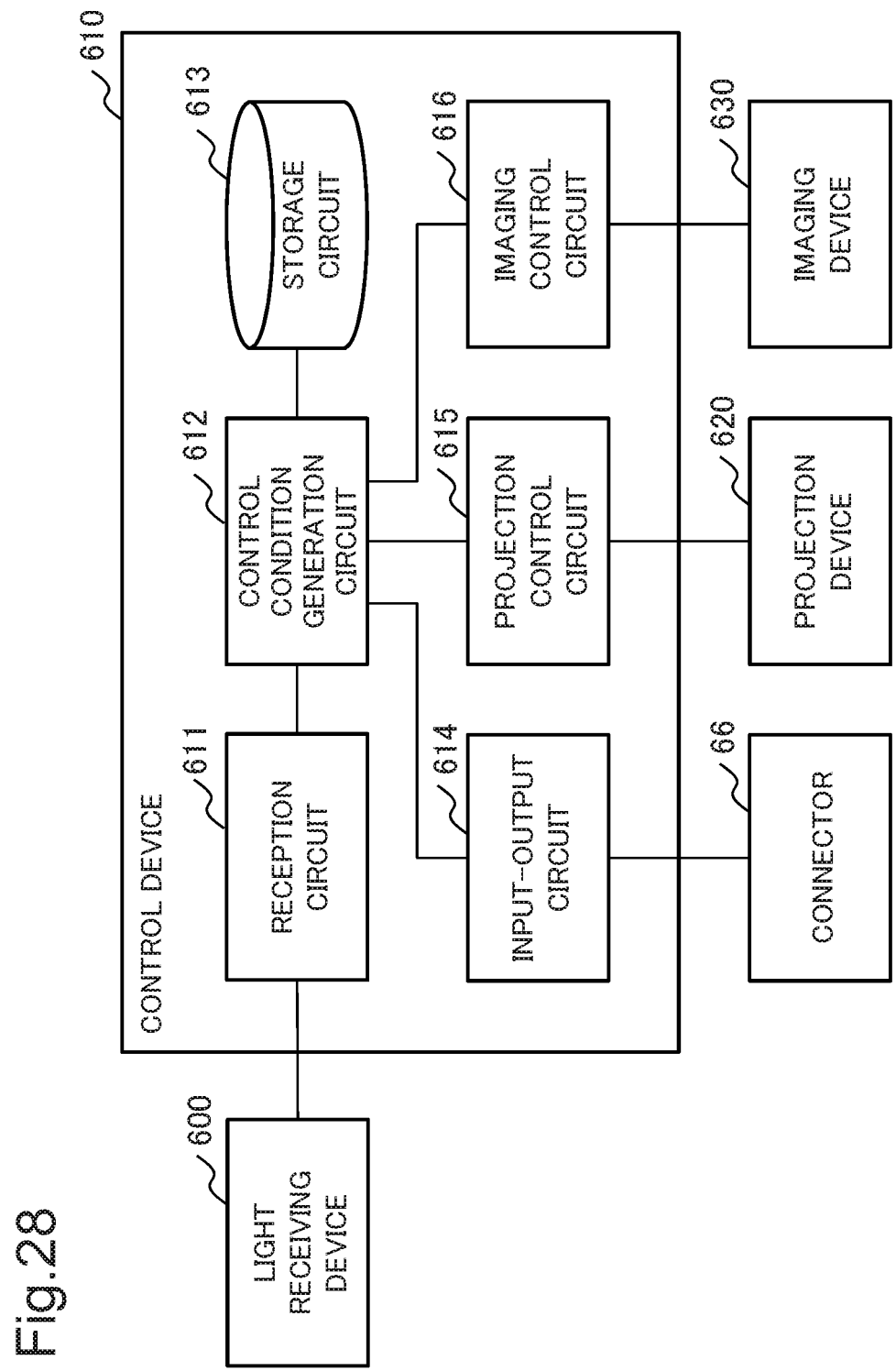
FIG. 28 is a block diagram illustrating a configuration example of a control device included in a light transmitting device in the light transmitting and receiving device according to the sixth example embodiment of the present invention.

FIG. 28 is a block diagram illustrating a configuration of the control device 610. As illustrated in FIG. 28, the control device 610 includes a reception circuit 611, a control condition generation circuit 612, a storage circuit 613, an input-output circuit 614, a projection control circuit 615, and an imaging control circuit 616. The reception circuit 611 is connected to the light receiving device 600. The input-output circuit 614 is connected to the connector 66. The projection control circuit 615 is connected to the projection device 620. The imaging control circuit 616 is connected to the imaging device 630. Components other than the input-output circuit 614 are similar to the corresponding components of the control device 510 according to the fifth example embodiment, and therefore detailed description thereof is omitted.

The input-output circuit 614 is connected to the control condition generation circuit 612. The input-output circuit 614 is an interface mediating connection between the light transmitting device 60 and the connector 66.

Figure 29:
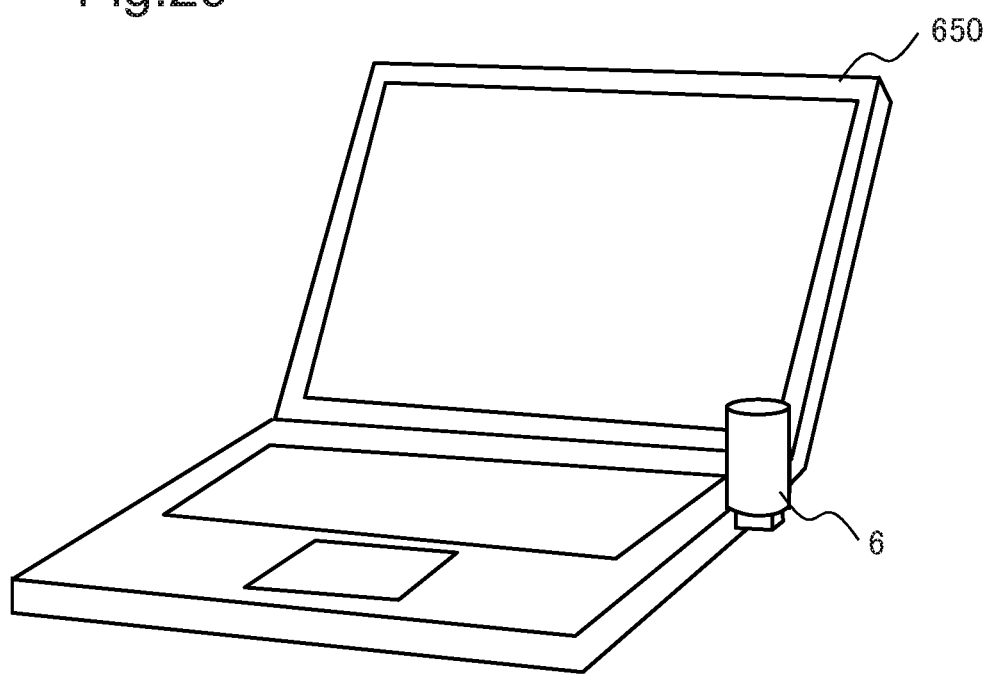
FIG. 29 is a schematic diagram illustrating a usage example of the light transmitting and receiving device according to the sixth example embodiment of the present invention.

FIG. 29 is a usage example of connecting the light transmitting and receiving device 6 to a notebook personal computer (hereinafter referred to as a terminal 650). The light transmitting and receiving device 6 is connected to the terminal 650 by connecting the connector 66 to a port on the terminal 650. By connecting the light transmitting and receiving device 6 to the terminal 650, an electric signal based on signal light received by the light transmitting and receiving device 6 and captured image data captured by the light transmitting and receiving device 6 can be received on the terminal 650 side. The devices may be configured in such a way that power is supplied to the light transmitting and receiving device 6 from the terminal 650 through the connector 66.

The devices may be configured in such a way that the terminal 650 controls the light transmitting and receiving device 6. Such a configuration allows the light transmitting and receiving device 6 to function as an antenna transmitting and receiving signal light in optical space communication.

As described above, the light receiving device according to the present example embodiment includes the connector connected to a port on external equipment. The control device is data-communicably connected to the external equipment through the connector.

MODIFIED EXAMPLE

Figure 30:
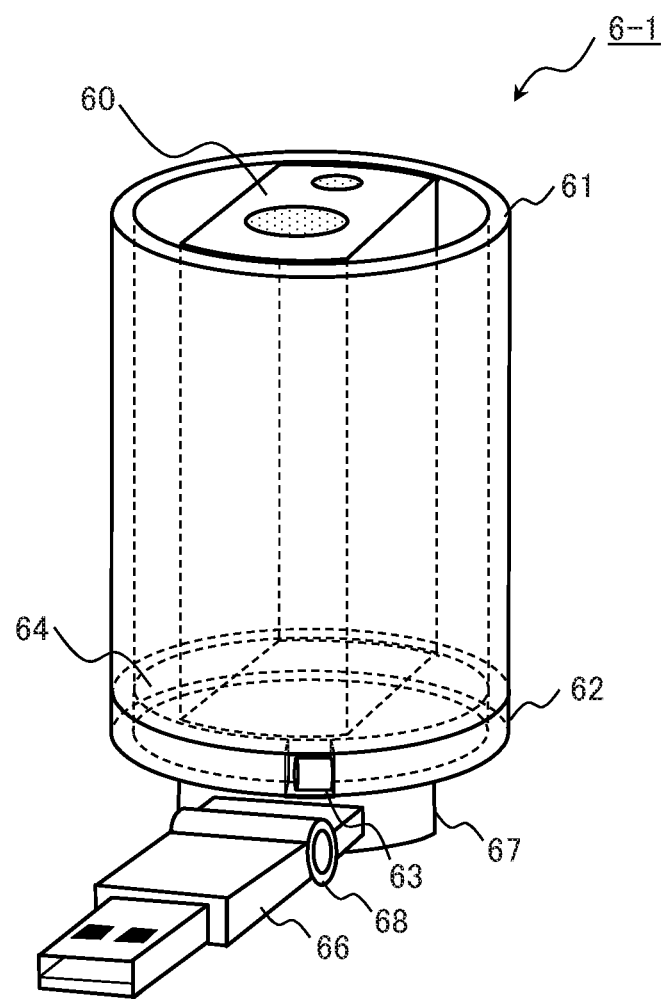
FIG. 30 is a perspective view of an example of a light transmitting and receiving device according to a modified example of the sixth example embodiment of the present invention.

A light transmitting and receiving device 6-1 in a modified example of the present example embodiment will be described with reference to a drawing. FIG. 30 is a perspective view illustrating an example of the light transmitting and receiving device 6-1 in this modified example. As illustrated in FIG. 30, the light transmitting and receiving device 6-1 includes a joint mechanism 68 in addition to a light transmitting device 60, a first light guide body 61, a second light guide body 62, a light receiver 63, a bottom plate 64, a connector 66, and a support part 67. The structure of the light transmitting and receiving device 6-1 other than the joint mechanism 68 is similar to that of the light transmitting and receiving device 6, and therefore detailed description thereof is omitted.

The joint mechanism 68 connects the connector 66 to the support part 67 in a bendable manner. In the example in FIG. 30, the joint mechanism 68 is capable of rotating around one axis in a direction perpendicular to the connection direction between the connector 66 and the support part 67. The joint mechanism 68 may be configured to be capable of rotating around multiple axes being two or more axes.

As described above, the connector on the light transmitting and receiving device in this modified example is connected to the light receiving device through the joint mechanism. In this modified example, a tilt of the light transmitting and receiving device can be changed by rotating the joint mechanism. Consequently, this modified example can adjust a tilt of the light transmitting and receiving device at an angle facilitating transmission and reception of signal light.

Optical Space Communication

An application of optical space communication using the light transmitting and receiving device 6 will be described with reference to drawings. FIG. 31 to FIG. 34 illustrate an example of performing optical space communication by arranging a plurality of terminals 650 each of which is connected to a light transmitting and receiving device 6 and placing one light transmitting and receiving device 6 above.

The upper light transmitting and receiving device 6 is placed in a state of the projection window 601 and the imaging window 602 of the first light guide body 61 pointing downward. The plurality of terminals 650 placed below are placed within a range of an imaging region 660 of the upper light transmitting and receiving device 6. It is assumed that the upper light transmitting and receiving device 6 is connected to an unillustrated higher level system and operates under control of the higher level system. The upper light transmitting and receiving device 6 may be connected to a communication line such as the Internet or an intranet and may function as a router.

Figure 31:
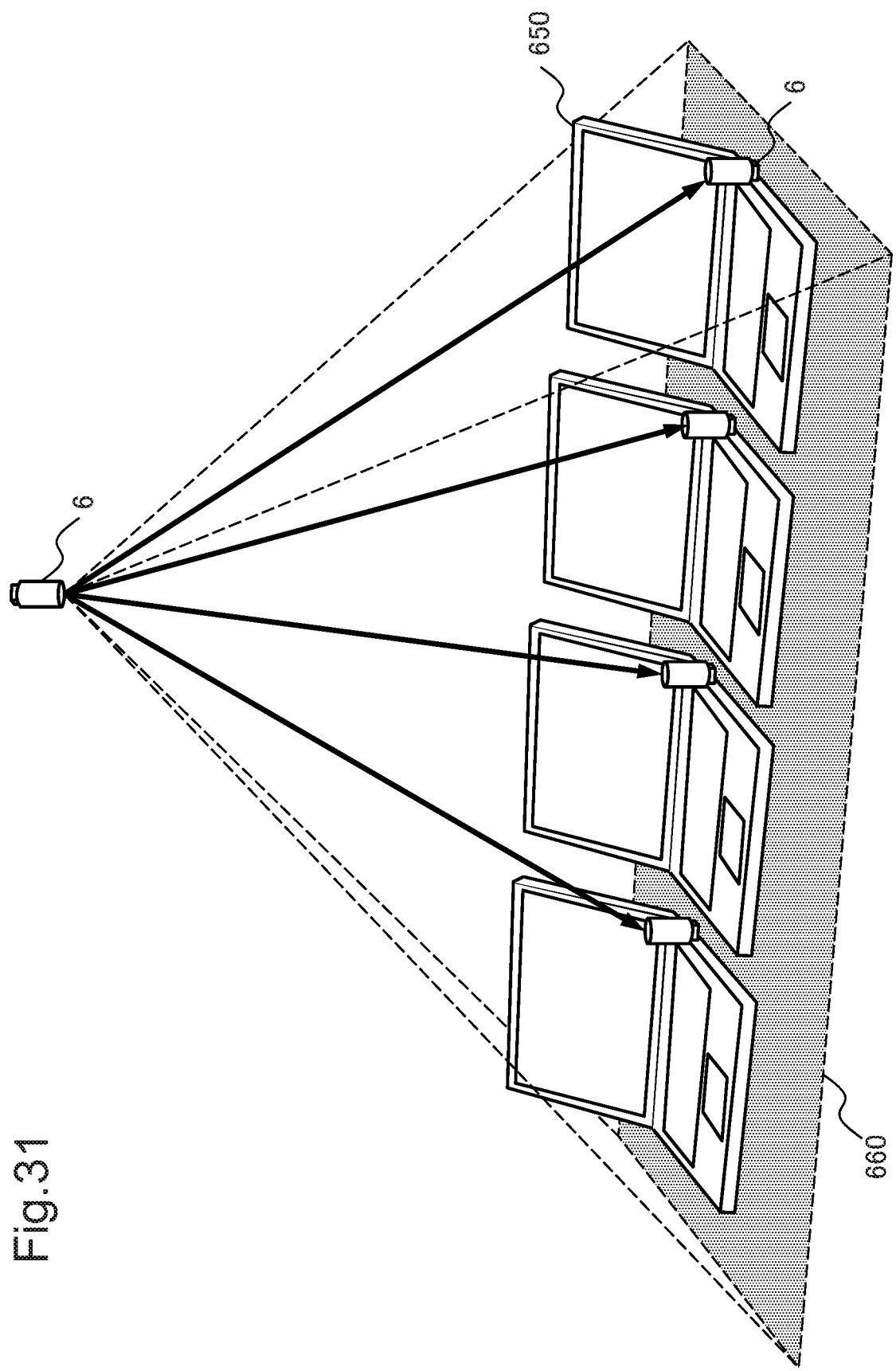
FIG. 31 is a schematic diagram for illustrating an example of optical space communication using the light transmitting and receiving device according to the sixth example embodiment of the present invention.
Figure 32:
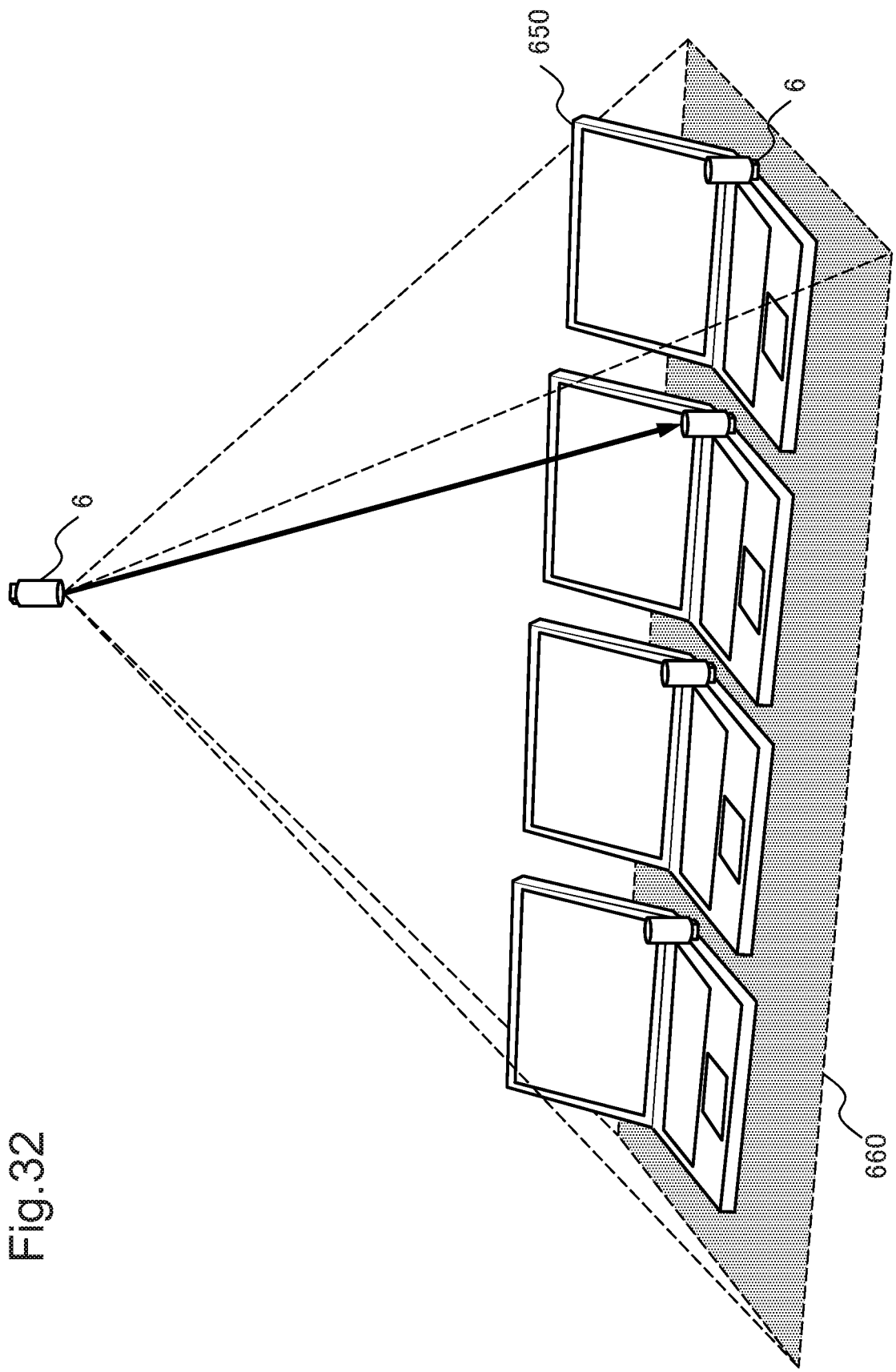
FIG. 32 is a schematic diagram for illustrating the example of optical space communication using the light transmitting and receiving device according to the sixth example embodiment of the present invention.

FIG. 31 and FIG. 32 illustrate a situation in which the upper light transmitting and receiving device 6 transmits signal light toward a light transmitting and receiving device 6 connected to a terminal 650 placed below. FIG. 31 illustrates a situation in which the upper light transmitting and receiving device 6 transmits signal light toward each of the plurality of terminals 650 placed below. FIG. 32 illustrates a situation in which the upper light transmitting and receiving device 6 transmits signal light toward one of the plurality of terminals 650 placed below.

For example, the light transmitting and receiving device 6 placed above captures an image of the imaging region 660 and transmits signal light toward a light transmitting and receiving device 6 positioned inside the imaging region 660. For example, the upper light transmitting and receiving device 6 transmits signal light toward a light transmitting and receiving device 6 emitting marker light in the imaging region 660. Further, for example, the upper light transmitting and receiving device 6 transmits signal light toward a light transmitting and receiving device 6 marked with specific identifier in the imaging region 660.

Each of the plurality of terminals 650 placed below receives, through a light transmitting and receiving device 6 connected to the own terminal, an electric signal generated based on signal light transmitted from the upper light transmitting and receiving device 6. Each of the plurality of terminals 650 executes processing based on an instruction from the higher level system included in the received electric signal.

Figure 33:
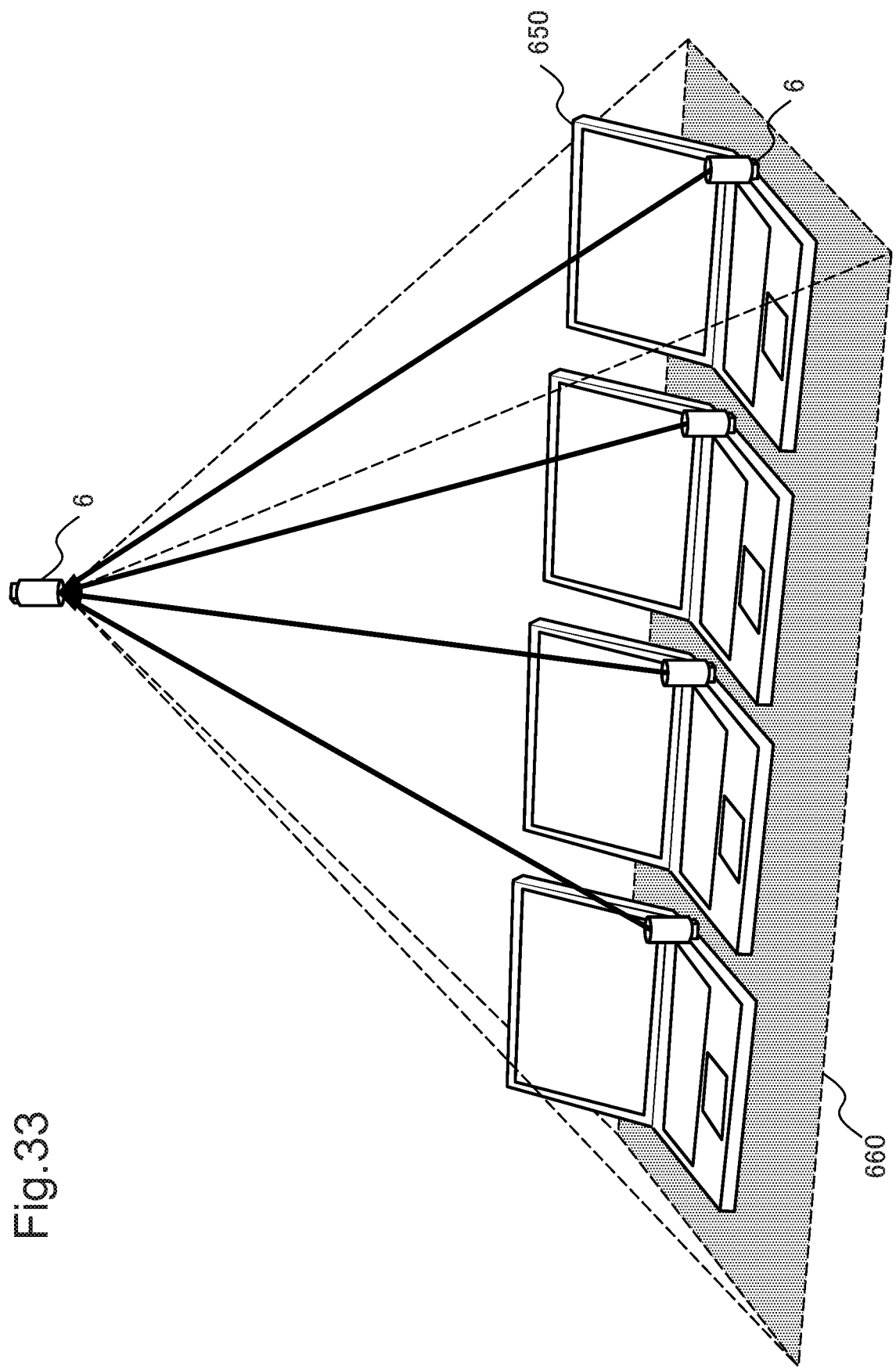
FIG. 33 is a schematic diagram for illustrating the example of optical space communication using the light transmitting and receiving device according to the sixth example embodiment of the present invention.
Figure 34:
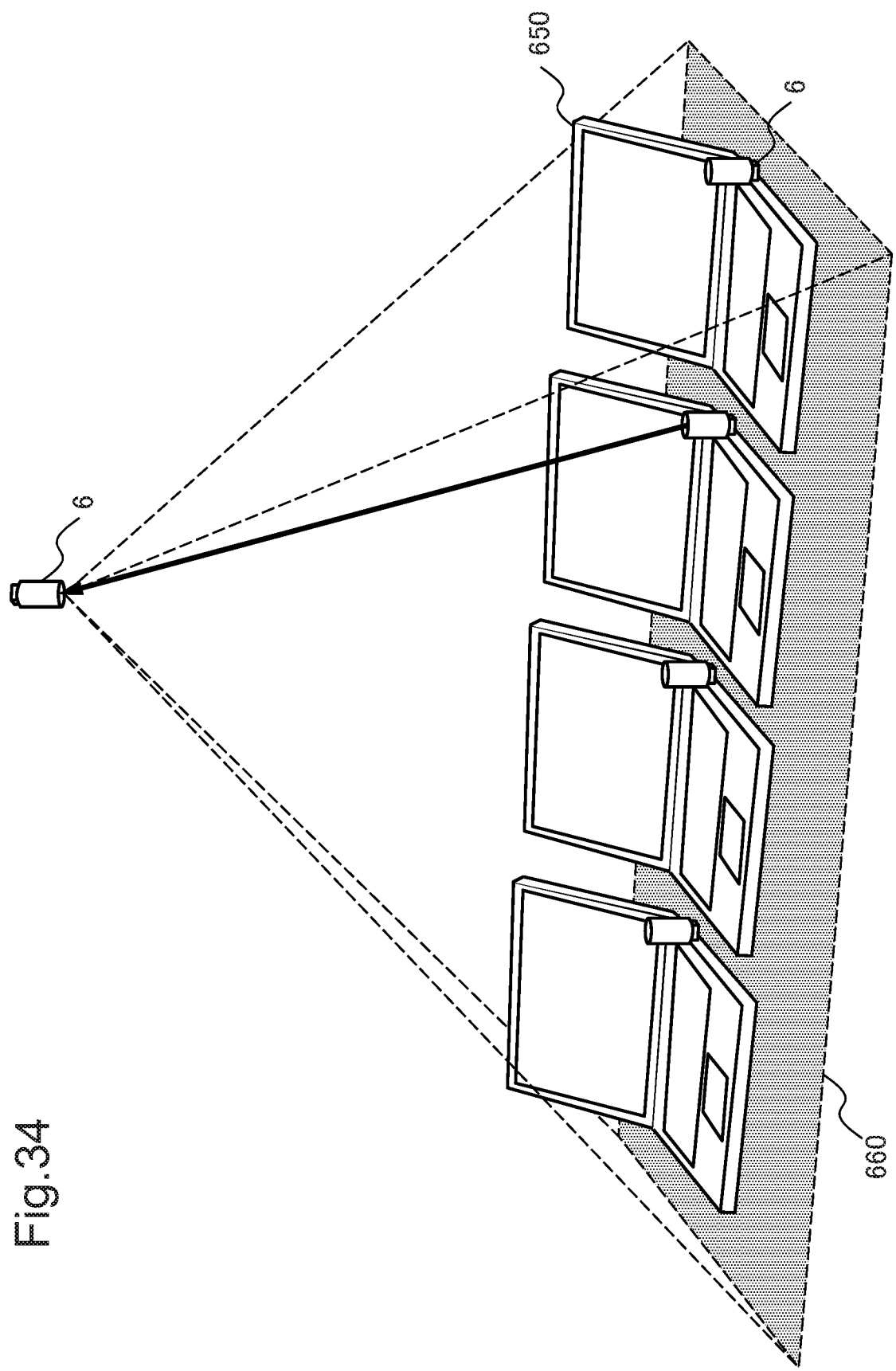
FIG. 34 is a schematic diagram for illustrating the example of optical space communication using the light transmitting and receiving device according to the sixth example embodiment of the present invention.

FIG. 33 and FIG. 34 illustrate a situation in which a light transmitting and receiving device 6 connected to a terminal 650 placed below transmits signal light toward the upper light transmitting and receiving device 6. FIG. 33 illustrates a situation in which each of the plurality of terminals 650 placed below transmits signal light toward the upper light transmitting and receiving device 6. FIG. 34 illustrates a situation in which one of the plurality of terminals 650 placed below transmits signal light toward the upper light transmitting and receiving device 6.

For example, each of the plurality of terminals 650 placed below transmits an electric signal based on an instruction from a higher level system to a light transmitting and receiving device 6. The light transmitting and receiving device 6 receiving the electric signal from the terminal 650 converts the electric signal to signal light and transmits the signal light toward the upper light transmitting and receiving device 6. The upper light transmitting and receiving device 6 receives signal light from each of the light transmitting and receiving devices 6 connected to the plurality of terminals 650 placed below, converts the received signal light into an electric signal, and transmits the signal to the higher level system.

As described above, the present example embodiment enables construction of an optical space communication system using a plurality of light transmitting and receiving devices.

Inter-Mobile-Unit Communication

Figure 35:
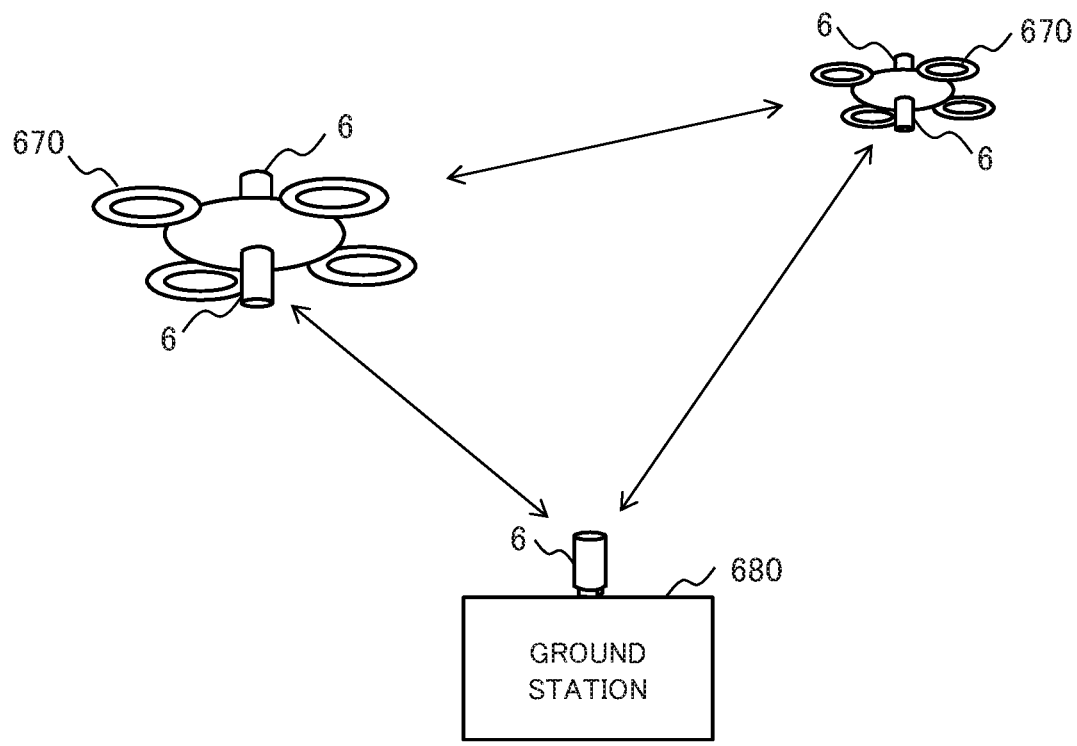
FIG. 35 is a conceptual diagram for illustrating an example of inter-mobile-unit communication using the light transmitting and receiving device according to the sixth example embodiment of the present invention.

An application of inter-mobile-unit communication using the light transmitting and receiving device 6 will be described with reference to a drawing. FIG. 35 illustrates an example of performing inter-mobile-unit communication by equipping the light transmitting and receiving device 6 on a mobile unit (hereinafter referred to as a drone 670). The drone 670 may be equipped with the light transmitting and receiving device 4 according to the fourth example embodiment or the light transmitting and receiving device 5 according to the fifth example embodiment.

In the example in FIG. 35, light transmitting and receiving devices 6 are equipped in the upper part and the lower part of the drone 670. A light transmitting and receiving device 6 is equipped in the upper part of the drone 670 in a state of the upper end of the first light guide body 61 pointing upward. On the other hand, a light transmitting and receiving device 6 is equipped in the lower part of the drone 670 in a state of the upper end of the first light guide body 61 pointing downward. The equipped positions of the light transmitting and receiving devices 6 are examples, and the devices may be equipped at positions other than the upper part and the lower part of the drone 670.

Further, in the example in FIG. 35, a ground station 680 performing optical space communication with the drone 670 is installed. At least one light transmitting and receiving device 6 is also installed on the ground station 680 at a position allowing optical space communication with the drone 670 in the air.

For example, a drone 670 receives signal light from the ground station 680 by use of a light transmitting and receiving device 6 equipped in the lower part of the own unit. The drone 670 receiving the signal light from the ground station 680 moves the own unit at a position based on the received signal light.

For example, a drone 670 receives signal light from another drone by use of either light transmitting and receiving device 6 equipped on the own unit. When receiving the signal light from the another drone, the drone 670 autonomously controls the own unit in such a way as to adjust a distance relation with the another drone.

As described above, the present example embodiment enables construction of an inter-mobile-unit communication network using a plurality of light transmitting and receiving devices. The light transmitting and receiving device according to the present example embodiment can be equipped on any mobile unit without being limited to a drone.

Hardware

A hardware configuration providing the control devices according to the fourth to sixth example embodiments will be described with a computer 90 in FIG. 36 as an example. The computer 90 in FIG. 36 is a configuration example for executing processing by the control device according to each example embodiment and does not limit the scope of the present invention.

Figure 36:
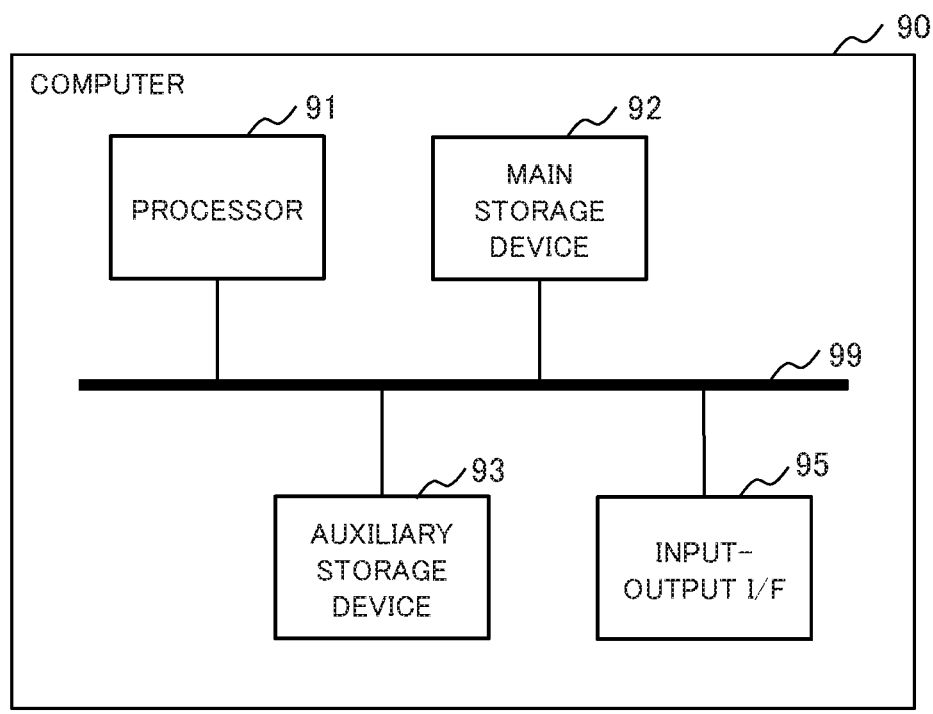
FIG. 36 is a block diagram illustrating an example of a hardware configuration providing the control device in the light transmitting and receiving device according to each example embodiment of the present invention.

As illustrated in FIG. 36, the computer 90 includes a processor 91, a main storage device 92, an auxiliary storage device 93, and an input-output interface 95. In FIG. 36, interface is abbreviated to I/F. The processor 91, the main storage device 92, the auxiliary storage device 93, and the input-output interface 95 are data-communicably connected to one another through a bus 99.

The processor 91 loads a program stored in the auxiliary storage device 93 or the like into the main storage device 92 and executes the loaded program. The control device according to the present example embodiment may be configured to use a software program installed on the computer 90. The processor 91 executes processing to be performed by the control device according to the present example embodiment.

The main storage device 92 includes a region into which a program is loaded. For example, the main storage device 92 may be a volatile memory such as a dynamic random access memory (DRAM). A nonvolatile memory such as a magnetoresistive random access memory (MRAM) may be configured and added as the main storage device 92.

The auxiliary storage device 93 stores various types of data. The auxiliary storage device 93 is configured with a local disk such as a hard disk or a flash memory. The main storage device 92 may be configured to store various types of data, and the auxiliary storage device 93 may be omitted.

The input-output interface 95 is an interface for connecting the computer 90 to peripheral equipment.

The above describes the example of a hardware configuration capable of providing the control device according to each example embodiment. The hardware configuration in FIG. 36 is an example of a hardware configuration for providing the control device according to each example embodiment and does not limit the scope of the present invention. A program causing a computer to execute processing related to the control device according to each example embodiment is also included in the scope of the present invention. Furthermore, a program-recording medium having the program according to each example embodiment recorded thereon is also included in the scope of the present invention.

Components of the control device according to each example embodiment may be freely combined. A component of the control device according to each example embodiment may be provided by software or may be provided by circuitry.

While the invention has been particularly shown and described with reference to example embodiments thereof, the invention is not limited to these embodiments. It will be understood by those of ordinary skill in the art that various changes in form and details may be made therein without departing from the spirit and scope of the present invention as defined by the claims.

The whole or part of the example embodiments disclosed above can be described as, but not limited to, the following supplementary notes.

(Supplementary Note 1)

A light receiving device including:

a first light guide body including at least a first light receiving surface and a first emitting end and guiding signal light entering from the first light receiving surface to the first emitting end;

a second light guide body including at least a second light receiving surface and a second emitting end, the second light receiving surface being connected to the first emitting end of the first light guide body, and guiding the signal light entering from the second light receiving surface to the second emitting end; and a Light Receiver Including a Light Receiving Part Connected to the second emitting end and converting the signal light received by the light receiving part into an electric signal.

(Supplementary Note 2)

The light receiving device according to Supplementary Note 1, wherein the second light guide body is curvilinearly formed, and the first light guide body has a shape of a cylindrical surface formed when moving a segment set up perpendicularly on the second light receiving surface along a shape of the second light guide body.

(Supplementary Note 3)

The light receiving device according to Supplementary Note 1 or 2, wherein the first light guide body is formed in a cylindrical shape with the first light receiving surface as a side, and the first emitting end is formed on either one of an upper surface and an undersurface, and the second light guide body is formed in a ring shape with open ends according to a shape of the first emitting end of the first light guide body formed in a cylindrical shape.

(Supplementary Note 4)

The light receiving device according to Supplementary Note 3, wherein the first light guide body is formed in a circular cylindrical shape, and the second light guide body is formed in a circular ring shape with open ends according to a shape of the first emitting end of the first light guide body formed in a circular cylindrical shape.

(Supplementary Note 5)

The light receiving device according to Supplementary Note 3, wherein the first light guide body is formed in a polygonal cylindrical shape, and the second light guide body is formed in a polygonal ring shape with open ends according to a shape of the first emitting end of the first light guide body formed in a polygonal cylindrical shape.

(Supplementary Note 6)

The light receiving device according to any one of Supplementary Notes 1 to 5, wherein the first light guide body includes a third light receiving surface facing the first light receiving surface, and a third emitting end to which signal light entering from the third light receiving surface is guided, and the second light receiving surface of the second light guide body is connected to the first emitting end and the third emitting end of the first light guide body.

(Supplementary Note 7)

The light receiving device according to any one of Supplementary Notes 1 to 6, wherein a transparent plate matching a shape of an upper surface of the first light guide body is placed on an upper surface of the first light guide body.

(Supplementary Note 8)

The light receiving device according to Supplementary Note 1, wherein the first light guide body is formed in a cylindrical shape with a closed upper surface, and a reflecting mirror pointing a reflection surface to inside the first light guide body is installed on at least part of a surface connecting an upper surface and a side.

(Supplementary Note 9)

The light receiving device according to Supplementary Note 1, wherein the first light guide body is formed in a spherical crown shape with the first light receiving surface as a surface, and the first emitting end is formed on a bottom, and the second light guide body is formed in a circular ring shape with open ends according to a shape of the first emitting end of the first light guide body.

(Supplementary Note 10)

A light transmitting and receiving device including:

a light receiving device including:
  a first light guide body including at least a first light receiving surface and a first emitting end, being formed in a cylindrical shape with the first light receiving surface as a side, and guiding signal light entering from the first light receiving surface to the first emitting end formed on either one of an upper surface and an undersurface;
  a second light guide body including at least a second light receiving surface and a second emitting end, being formed in a ring shape with open ends according to a shape of the first emitting end of the first light guide body formed in a cylindrical shape, the second light receiving surface being connected to the first emitting end of the first light guide body, and guiding the signal light entering from the second light receiving surface to the second emitting end; and
  a light receiver including a light receiving part connected to the second emitting end of a second light guide body, converting the signal light received by the light receiving part into an electric signal, and outputting the electric signal; and
a light transmitting device being equipped inside a cylinder formed by the first light guide body, receiving an electric signal received from the light receiver, and projecting projection light based on a received electric signal.

(Supplementary Note 11)

The light transmitting and receiving device according to Supplementary Note 10, wherein the light transmitting device includes:
  a projection device including a light source, a spatial light modulator including a display part modulating and reflecting emitted light emitted from the light source, and a projection optical system projecting reflected light reflected by a display part of the spatial light modulator; and
  a control device outputting a light source control condition for controlling the light source and a modulation element control condition for controlling the spatial light modulator to the projection device, based on an electric signal from the light receiver.

(Supplementary Note 12)

The light transmitting and receiving device according to Supplementary Note 11, wherein the spatial light modulator is a phase-modulation type.

(Supplementary Note 13)

The light transmitting and receiving device according to Supplementary Note 11 or 12, wherein the light transmitting device includes an imaging device capturing an image of a range including a projection range of the projection device, and the control device outputs an imaging control condition for controlling the imaging device to the projection device, based on an electric signal from the light receiver.

(Supplementary Note 14)

The light transmitting and receiving device according to Supplementary Note 11 or 12, further including a connector connected to a port on external equipment, wherein the control device is data-communicably connected to the external equipment through the connector.

(Supplementary Note 15)

The light transmitting and receiving device according to Supplementary Note 14, wherein the connector is connected to the light receiving device through a joint mechanism.

REFERENCE SIGNS LIST 1, 2, 3 Light receiving device
4, 5, 6 Light transmitting and receiving device
11, 21, 31, 41, 51, 61 First light guide body
12, 22, 32, 42, 52, 62 Second light guide body
13, 23, 33, 43, 53, 63 Light receiver
14, 24, 34, 44, 54, 64 Bottom plate
25 Reflecting mirror
35 Top plate
40, 50, 60 Light transmitting device
66 Connector
67 Support part
68 Joint mechanism
101, 102, 103 Directional light guide plate
111, 211 First light guide part
112, 212 First directional reflection part
121 Second light guide part
122 Second directional reflection part
141, 142, 143 Transparent light guide part
151, 152, 153 Directional reflection part
161, 162 Reflection structure
171 Reflecting mirror
172 Reflection part
173 Diffraction grating array 400, 500 Light receiving device
410, 510, 610 Control device
411, 511, 611 Reception circuit
412, 512, 612 Control condition generation circuit
413, 513, 613 Storage circuit
415, 515, 615 Projection control circuit
420, 520, 620 Projection device
421 Light source
422 Emitting part
423 Collimator
425 Spatial light modulator
427 Projection optical system
471 Fourier transform lens
472 Aperture
473 Projection lens
516, 616 Imaging control circuit
630, 630 Imaging device
531 Imaging element
533 Image processor
535 Internal memory
537 Data output circuit
614 Input-output circuit
650 Terminal
670 Drone
680 Ground station

The invention claimed is:

1. A light receiving device comprising:
a first light guide body including at least a first light receiving surface and a first emitting end, the second light guide body and guiding signal light entering from the first light receiving surface to the first emitting end;
a second light guide body including at least a second light receiving surface and a second emitting end, the second light receiving surface being connected to the first emitting end of the first light guide body, the second light guide body guiding the signal light entering from the second light receiving surface to the second emitting end; and
a light receiver including a light receiving part connected to the second emitting end, the light receiver converting the signal light received by the light receiving part into an electric signal, wherein
the first light guide body is formed in a cylindrical shape with the first light receiving surface as a side, and the first emitting end is formed on either one of an upper surface and an undersurface, and
the second light guide body is formed in a ring shape with open ends according to a shape of the first emitting end of the first light guide body formed in the cylindrical shape.

2. The light receiving device according to claim 1, wherein
the first light guide body is formed in a circular cylindrical shape, and
the second light guide body is formed in a circular ring shape with the open ends according to the shape of the first emitting end of the first light guide body formed in the circular cylindrical shape.

3. The light receiving device according to claim 2, wherein
the first light guide body includes a third light receiving surface facing the first light receiving surface, and a third emitting end to which signal light entering from the third light receiving surface is guided, and
the second light receiving surface of the second light guide body is connected to the first emitting end and the third emitting end of the first light guide body.

4. The light receiving device according to claim 1, wherein
the first light guide body is formed in a polygonal cylindrical shape, and
the second light guide body is formed in a polygonal ring shape with the open ends according to the shape of the first emitting end of the first light guide body formed in the polygonal cylindrical shape.

5. The light receiving device according to claim 4, wherein
the first light guide body includes a third light receiving surface facing the first light receiving surface, and a third emitting end to which signal light entering from the third light receiving surface is guided, and
the second light receiving surface of the second light guide body is connected to the first emitting end and the third emitting end of the first light guide body.

6. The light receiving device according to claim 1, wherein
a transparent plate matching a shape of an upper surface of the first light guide body is placed on an upper surface of the first light guide body.

7. The light receiving device according to claim 1, wherein
the first light guide body is formed in the cylindrical shape with a closed upper surface, and a reflecting mirror pointing a reflection surface to inside the first light guide body is installed on at least part of a surface connecting the upper surface and a side.

8. The light receiving device according to claim 1, wherein
the first light guide body is formed in a spherical crown shape with the first light receiving surface as a surface, and the first emitting end is formed on a bottom, and
the second light guide body is formed in a circular ring shape with the open ends according to the shape of the first emitting end of the first light guide body.

9. The light receiving device according to claim 1, wherein
the second light guide body is curvilinearly formed, and
the first light guide body has the shape of the cylindrical surface formed when moving a segment set perpendicularly on the second light receiving surface along the ring shape of the second light guide body.

10. The light receiving device according to claim 1, wherein
the first light guide body includes a third light receiving surface facing the first light receiving surface, and a third emitting end to which signal light entering from the third light receiving surface is guided, and
the second light receiving surface of the second light guide body is connected to the first emitting end and the third emitting end of the first light guide body.

11. A light receiving device comprising:
a first light guide body including at least a first light receiving surface and a first emitting end, the second light guide body and guiding signal light entering from the first light receiving surface to the first emitting end;
a second light guide body including at least a second light receiving surface and a second emitting end, the second light receiving surface being connected to the first emitting end of the first light guide body, the second light guide body guiding the signal light entering from the second light receiving surface to the second emitting end; and a light receiver including a light receiving part connected to the second emitting end, the light receiver converting the signal light received by the light receiving part into an electric signal, wherein the first light guide body includes a third light receiving surface facing the first light receiving surface, and a third emitting end to which the signal light entering from the third light receiving surface is guided, and the second light receiving surface of the second light guide body is connected to the first emitting end and the third emitting end of the first light guide body.

12. The light receiving device according to claim 11, wherein the second light guide body is curvilinearly formed, and the first light guide body has a shape of a cylindrical surface formed when moving a segment set perpendicularly on the second light receiving surface along a shape of the second light guide body.

13. A light transmitting and receiving device comprising:
a light receiving device including:
a first light guide body including at least a first light receiving surface and a first emitting end and being formed in a cylindrical shape with the first light receiving surface as a side, signal light entering from the first light receiving surface being guided to the first emitting end formed on either one of an upper surface and an undersurface;

a second light guide body including at least a second light receiving surface and a second emitting end, being formed in a ring shape with open ends according to a shape of the first emitting end of the first light guide body formed in a cylindrical shape, the second light receiving surface being connected to the first emitting end of the first light guide body, and guiding the signal light entering from the second light receiving surface to the second emitting end; and a light receiver including a light receiving part connected to the second emitting end of a second light guide body, converting the signal light received by the light receiving part into an electric signal, and outputting the electric signal; and a light transmitting device being equipped inside a cylinder formed by the first light guide body, receiving the electric signal from the light receiver, and projecting projection light based on the received electric signal.

14. The light transmitting and receiving device according to claim 13, wherein the light transmitting device includes:

a projection device including a light source, a spatial light modulator including a display part modulating and reflecting emitted light emitted from the light source, and a projection optical system projecting reflected light reflected by a display part of the spatial light modulator; and a control device outputting a light source control condition for controlling the light source and a modulation element control condition for controlling the spatial light modulator to the projection device, based on an electric signal from the light receiver.

15. The light transmitting and receiving device according to claim 14, wherein the spatial light modulator is a phase-modulation type.

16. The light transmitting and receiving device according to claim 14, wherein the light transmitting device includes an imaging device capturing an image of a range including a projection range of the projection device, and the control device outputs an imaging control condition for controlling the imaging device to the projection device, based on the electric signal from the light receiver.

17. The light transmitting and receiving device according to claim 14, further comprising a connector connected to a port on external equipment, wherein the control device is data-communicably connected to the external equipment through the connector.

18. The light transmitting and receiving device according to claim 17, wherein the connector is connected to the light receiving device through a joint mechanism.

* * * * *